(12) United States Patent
Chua et al.

(10) Patent No.: US 9,064,980 B2
(45) Date of Patent: Jun. 23, 2015

(54) DEVICES HAVING REMOVED ALUMINUM NITRIDE SECTIONS

(75) Inventors: Christopher L. Chua, San Jose, CA (US); Brent S. Krusor, Fremont, CA (US); Thomas Wunderer, Palo Alto, CA (US); Noble M. Johnson, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 13/217,844

(22) Filed: Aug. 25, 2011

(65) Prior Publication Data

US 2013/0049005 A1 Feb. 28, 2013

(51) Int. Cl.
*H01L 29/15* (2006.01)
*H01L 21/00* (2006.01)
*H01L 33/00* (2010.01)

(52) U.S. Cl.
CPC ..... *H01L 33/0079* (2013.01); *Y10T 428/24802* (2015.01)

(58) Field of Classification Search
USPC ........... 257/642–643, 759, E25.008–E25.009
See application file for complete search history.

(56) References Cited

U.S. PATENT DOCUMENTS

| | | | |
|---|---|---|---|
| 5,739,945 A | 4/1998 | Tayebati | |
| 6,023,354 A | 2/2000 | Goldstein et al. | |
| 7,232,739 B2 | 6/2007 | Kerdiles et al. | |
| 7,452,739 B2 | 11/2008 | Chu et al. | |
| 7,675,077 B2 | 3/2010 | Shei et al. | |
| 7,682,855 B2 | 3/2010 | Yang | |
| 8,124,993 B2 * | 2/2012 | Bour et al. | 257/98 |
| 2002/0014629 A1 * | 2/2002 | Shibata et al. | 257/79 |
| 2006/0043396 A1 * | 3/2006 | Tsuda et al. | 257/94 |
| 2007/0145384 A1 * | 6/2007 | Gardner et al. | 257/79 |
| 2007/0158639 A1 * | 7/2007 | Yang et al. | 257/14 |
| 2007/0259504 A1 * | 11/2007 | Bour et al. | 438/341 |
| 2008/0121913 A1 * | 5/2008 | McKenzie et al. | 257/98 |
| 2008/0274574 A1 * | 11/2008 | Yun | 438/47 |
| 2008/0303033 A1 | 12/2008 | Brandes | |
| 2009/0090932 A1 * | 4/2009 | Bour et al. | 257/103 |
| 2009/0121243 A1 * | 5/2009 | Erchak et al. | 257/96 |
| 2009/0278233 A1 * | 11/2009 | Pinnington et al. | 257/615 |
| 2010/0135349 A1 * | 6/2010 | Schowalter et al. | 372/45.012 |
| 2010/0140632 A1 * | 6/2010 | Doussiere | 257/88 |
| 2010/0151602 A1 * | 6/2010 | Knollenberg et al. | 438/29 |
| 2010/0187496 A1 * | 7/2010 | Yan | 257/13 |
| 2010/0244197 A1 * | 9/2010 | Arena et al. | 257/615 |
| 2011/0018104 A1 | 1/2011 | Nagashima et al. | |
| 2011/0124139 A1 * | 5/2011 | Chang | 438/40 |

OTHER PUBLICATIONS

Schujman et al., "GaN-ready aluminum nitride substrates for costeffective, very low dislocation density III-nitride LEDs", Jan. 2011, 30 pages.

(Continued)

*Primary Examiner* — Chuong A Luu
*Assistant Examiner* — Moin Rahman
(74) *Attorney, Agent, or Firm* — Hollingsworth Davis, LLC

(57) ABSTRACT

One or more layers are epitaxially grown on a bulk crystalline AlN substrate. The epitaxial layers include a surface which is the initial surface of epitaxial growth of the epitaxial layers. The AlN substrate is substantially removed over a majority of the initial surface of epitaxial growth.

31 Claims, 18 Drawing Sheets

(56) References Cited

OTHER PUBLICATIONS

Zhou et al., "Accurately nonselective and selective etching of GaAs/$Al_{0.8}Ga_{0.2}As$/AlAs structure for making air-gap cavity", Proc. of SPIE, vol. 5280, 2004, pp. 889-895.
Sharma et al., "Vertically oriented GaN-based air-gap distributed Bragg reflector structure fabricated using band-gap-selective photoelectrochemical etching", Applied Physics Letters, Vo. 87, Jul. 29, 2005, 3 pages.
Khamsehpour et al., "Use of laser reflectometry for end-point detection during the etching of magnetic thin films", J. Vac. Sci. Technol. A 15(4), Jul./Aug. 1997, pp. 2069-2073.
Cho et al., "Control of wet-etching thickness in the vertical cavity surface emitting laser structure by in situ laser reflectometry", J. Vac. Sci. Technol. B 17.6., Nov./Dec. 1999, pp. 2626-2630.
Chu et al., "Emission characteristics of optically pumped GaN-based vertical-cavity surface-emitting lasers", Applied Physics Letters, vol. 89, 121112, 2006, 3 pages.
Cao et al., "Fabrication and performance of blue GaN-based vertical-cavity surface emitting laser employing AlN/GaN and $Ta_2O_5$/$SiO_2$ distributed Bragg reflector", Applied Physics Letters, vol. 87, 081105, 2005, 3 pages.
Ng et al., "Distributed Bragg reflectors based on AlN/GaN multilayers", Applied Physics Letters, vol. 74(70, Feb. 15, 1999, 3 pages.
Cho, "GaN Based Heterostructure Growth and Application to Electronic Devices and Gas Sensors", 2009, 251 pages.
Wang et al., "Optically Pumped GaN-based Vertical Cavity Surface Emitting Lasers: Technology and Characteristics", Japanese Journal of Applied Physics vol. 46, No. 8B, 2007, pp. 5397-5407.
Mills, "Expanding horizons for nitride devices & materials", III-Vs Review, vol. 19, No. 1, Feb. 2006 www.threes-fives.com, pp. 25-33.
Sharma et al., "Gallium-nitride-based microcavity light-emitting diodes with air-gap distributed Bragg reflectors" Applied Physics Letters, vol. 91, 211108, 2007, 3 pages.

\* cited by examiner

DEVICES HAVING REMOVED ALUMINUM NITRIDE SECTIONS

STATEMENT REGARDING FEDERALLY SPONSORED RESEARCH AND DEVELOPMENT

This invention was made with Government support under U.S. Army Cooperative Agreement No. W911NF-10-02-0102 awarded by the Defense Advanced Research Projects Agency (DARPA). The Government has certain rights in this invention.

SUMMARY

Devices having removed or thinned aluminum nitride (AlN) sections and methods for forming such devices are discussed in this disclosure. Some embodiments involve light emitting devices that include one or more epitaxial layers including a light emitting layer and first and second heterostructures. The first heterostructure is epitaxially grown on a bulk crystalline AlN substrate which is subsequently removed from the epitaxial layers. The first heterostructure has a first surface and a second surface, where the first surface of the first heterostructure is an initial surface of epitaxial growth of the epitaxial layers. A light emitting layer is epitaxially grown above the second surface of the first heterostructure. A second heterostructure is epitaxially grown above the light emitting layer. The light emitting device does not include the bulk crystalline AlN substrate.

According to some embodiments, a light emitting device includes a first epitaxially grown heterostructure having a first surface and a second surface and a light emitting layer epitaxially grown above the second surface of the first heterostructure. A second epitaxially grown heterostructure is grown over the light emitting layer. The device is configured so that light generated by the light emitting layer in a wavelength range of less than about 365 nm can emerge from the device through the first surface of the first hetero structure. A defect density near the first surface is less than about $10^8$ cm$^{-3}$.

Some embodiments are directed to a light emitting device that includes a light emitting layer between first and second heterostructures. The first heterostructure is epitaxially grown on a bulk crystalline AlN substrate. The light emitting layer is epitaxially grown above the first heterostructure. The second heterostructure is epitaxially grown above the light emitting layer. The bulk crystalline AlN substrate has a chemically etched thickness of less than about 50 μm.

Some embodiments involve an article of one or more epitaxial layers including at least one of AlN, GaN AlGaN, InGaN, InN, and InAlGaN and having a first surface which is the initial surface of epitaxial growth. The article does not include a bulk substrate, but may include an AlN substrate remnant that remains after the removal process, e.g., a chemically etched AlN substrate remnant that has a thickness less than about 50 μm. A defect density within 100 nm of the initial surface of epitaxial growth is less than about $10^8$ cm$^{-3}$. The article may be optically transparent for light having wavelengths above about 200 nm or above about 365 nm.

Some embodiments involve a method of forming a device. A lattice strained epitaxial layer is grown on a bulk AlN substrate. The epitaxial layer has a defect density less than about $10^8$ cm$^{-3}$ near a surface of initial epitaxial growth. The bulk AlN substrate is substantially removed by either completely removing the substrate or by chemically etching to leave a substrate remnant having a thickness of less than about 50 μm. After the substrate is substantially removed, the lattice strain of the epitaxial layer is partially or fully relaxed, while the defect density near the surface of initial epitaxial growth is substantially maintained. Substantial removal of the substrate involves removing the substrate over a majority (greater than 50%) of the initial surface of epitaxial growth or leaving a substrate remnant over a majority of the initial surface of epitaxial growth.

DESCRIPTION OF VARIOUS EMBODIMENTS

Figure 1:
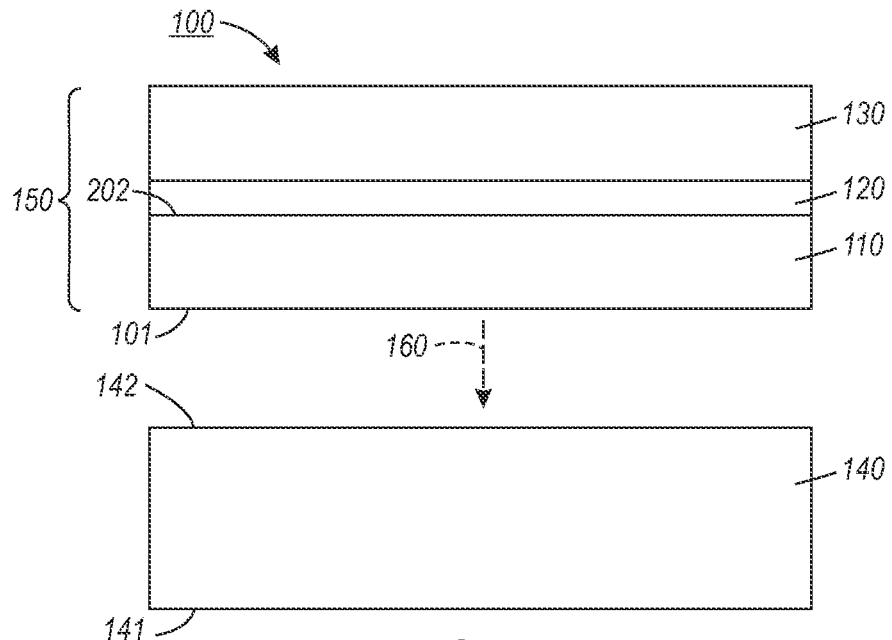
FIG. 1 is a block diagram that depicts a subassembly that initially includes a bulk AlN substrate and epitaxial layers formed on a bulk aluminum nitride (AlN) substrate.

Light emitting devices operating in the 200 to 365 nm range can potentially be used in a number of applications, including water purification, disinfection, UV curing, phototherapy, and medical diagnostics. Devices operating in this wavelength range have been fabricated based on group III-nitride system alloys comprising one or more of aluminum (Al), gallium (Ga), indium (In), boron (B) along with nitrogen (N). Fabrication of these devices can involve epitaxially growing material layers on a bulk crystalline aluminum nitride (AlN) substrate. Unlike devices utilizing other types of substrates, such as GaAs or sapphire substrates, devices grown on bulk AlN substrates have previously been inseparable from their substrate because AlN substrates are not successfully removed using the techniques developed for other types of substrates.

Chemical processes for etching AlN crystal wafers are described herein. In some implementations, the nitrogen polar face of the bulk AlN substrate is selectively etched. These techniques enable a new generation of AlN-grown high-bandgap devices that can be separated from their native substrate.

Approaches described this disclosure involve epitaxially growing one or more layers on bulk crystalline AlN substrates and subsequently substantially removing the bulk AlN substrate. These approaches may be used in the fabrication of various types of devices that incorporate light emitting layers and/or may be used in the fabrication of stand-alone epitaxially grown templates/substrates and/or may be useful to fabricate other type of subassemblies.

In some cases, the epitaxial layers of a subassembly that was grown on an AlN substrate may form an optoelectronic device as a light emitting diode (LED) or a laser diode (LD) that has its AlN substrate substantially removed. In some cases, the subassembly may include epitaxial layers without a light emitting layer. In these cases, after the bulk AlN substrate is removed, the epitaxially grown layers are useful as stand-alone epitaxially grown AlN templates/substrates. These epitaxially grown templates/substrates can be sold as a piece parts which may be incorporated into various device structures in subsequent processing steps.

Bulk crystalline AlN substrates are formed by growing a single crystal AlN boule from a seed crystal and slicing the boule into wafer substrates. Layers of materials, e.g., III-nitride materials that are substantially lattice matched to the bulk AlN substrate may be epitaxially grown on the wafer substrates with high crystalline quality to form the subassemblies discussed herein. The subassembly layers have a surface nearest the bulk AlN substrate which is the initial surface of epitaxial growth. After removal of the bulk AlN substrate, the epitaxially grown layers can have a low defect density near the initial surface of epitaxial growth due to the substantial lattice match with the bulk crystalline AlN substrate. For example, the defect density of the epitaxial layers may be lower than about $10^8$ cm$^{-3}$ or in a range of about $10^{10}$ cm$^{-3}$ to about $10^3$ cm$^{-3}$ within about 100 nm of the initial surface of epitaxial growth. The defect density of the epitaxial layers can be related to the defect density of the substrate. For example, the defect density of the epitaxial layers may be in range of about 10 to about 1000 times the defect density of the substrate.

Substantial removal of the substrate involves removing the substrate over a majority of the initial surface of epitaxial growth. Substantial removal of the substrate may involve thinning, e.g., by chemically etching, the AlN substrate over a majority of the initial surface of epitaxial growth. In some cases, a substrate remnant may remain at over a majority of the initial surface of epitaxial growth after the etching process. The substrate remnant has a thickness between about 50 µm and 0 nm (completely removed) or less than about 50 µm.

Bulk AlN substrates are substantially optically absorbing for some wavelength ranges, e.g., for wavelengths above 365 nm and/or in the UV wavelength range of about 200 nm to about 365 nm, because of color centers, impurities, and/or other defects in the material. For light emitting devices, substantial removal of the bulk AlN substrate allows light to emerge from the substrate side of the device (denoted herein as the back side of the device), i.e., through the surface where the bulk AlN was substantially removed. Substantial removal of the bulk AlN substrate can also provide access to the backside of the device for other purposes such as surface texturing and/or electrical contacts. For stand-alone epitaxial templates/substrates, substantial removal of the bulk AlN substrate allows the epitaxial template/substrate to be substantially optically transparent to light having wavelengths above 365 nm and/or in the wavelength range of about 200 nm to about 365 nm.

In some light emitting device designs, it is particularly helpful to extract light from the back side of the device, because layers above the active light emitting layers are optically absorbing, at least to some extent. In the case of laser diodes, an optically absorbing substrate contributes to waveguide materials loss, thus increasing the required gain to achieve lasing. Aluminum nitride substrates are electrically insulating, so leaving these substrates on the device precludes vertical injection laser diode architectures which have back side contacts.

FIG. 1 is a block diagram that depicts a subassembly 100 that initially includes a bulk crystalline AlN substrate 140 and epitaxial layers 150 formed on the bulk AlN substrate 140. Although FIG. 1 illustrates several epitaxial layers 150, the subassembly may include more or fewer epitaxial layers and in some implementations may include only one epitaxial layer. The AlN substrate 140 has a first surface 141 and a second surface 142. The bulk crystalline AlN substrate may be grown as an ingot that is sliced at the first and second surfaces 141, 142.

In some cases, as illustrated in FIG. 1, epitaxial layers 150 include one or more light emitting layers 120 sandwiched in between first and second heterostructures 110, 130. The light emitting layers 120 and/or the heterostructures 110, 130 may be formed of GaN, AlGaN, InN, InGaN, and/or InAlGaN, as these material systems can be grown epitaxially on the AlN with low defect density. In this example, the first heterostructure 110 is epitaxially grown above the bulk AlN substrate 140. The growth of the epitaxial layers 150 proceeds from the first surface 101 of the first heterostructure 110 which grows epitaxially on the second surface 142 of the AlN substrate 140. The first heterostructure 110 may comprise multiple layers including defect reduction layers, strain management layers, and/or electrical current distribution layers. The active region 120 is subsequently grown above the first heterostructure 110 and the second heterostructure 130 is grown above the active region 120. As indicated by the dashed line 160, after formation of the subassembly 100, the bulk AlN substrate 140 is substantially removed.

Figure 2:
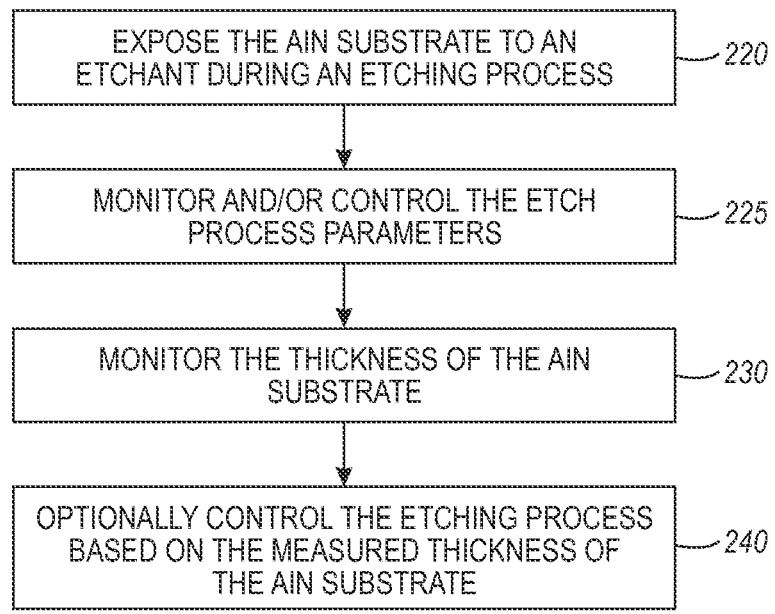
FIG. 2 illustrates a method of removing a bulk AlN substrate from a subassembly in accordance with some embodiments.

FIG. 2 illustrates a method of removing a bulk AlN substrate from a subassembly. The subassembly comprises the bulk AlN substrate and one or more epitaxially grown layers on the bulk AlN substrate. For example, the one or more epitaxial layers may comprise a light emitting device having a light emitting layer or may comprise epitaxial layers that do not include a light emitting layer.

The bulk AlN substrate, e.g., the nitrogen-polar (N-polar) face of the substrate, is exposed to an etchant comprising phosphoric acid that is at an elevated temperature, e.g., at the boiling point of the phosphoric acid, in a wet etching process 220. In the LED structures described herein, e.g., as schematically illustrated in FIG. 1, the bottom of the bulk AlN substrate can present an N-polar face to the etchant. Phosphoric acid in a concentration range equal to or greater than about 85% or in a range of about 87% to about 96% and a temperature range of 160° C. to 210° C. can dissolve bulk single crystal AlN within a reasonable time. In some configurations, the phosphoric acid used for can have a concentration range of 87% to 92% with a temperature range of about 160° C. to about 180° C., for example. This solution can also be used to etch AlN substrates presenting an Al-polar surface after an initial hydrolysis of the surface.

The etch process parameters, e.g., concentration and/or temperature of the phosphoric acid may be monitored 225 during the etching process and may be controlled so that the concentration and/or temperature of the phosphoric acid remains within predetermined concentration/temperature ranges. During the etching process, the thickness of the AlN substrate can be monitored 230. In some cases, the thickness of the AlN substrate is measured ex situ which involves periodically removing the subassembly from the etching process, measuring the thickness of subassembly and/or the thickness of the aluminum nitride substrate, and possibly returning the subassembly to the etching process after the measurement. In other cases, the thickness of the subassembly and/or the AlN substrate can be measured in situ as discussed below.

The etching process can be optionally controlled 240 based on the measured thickness of the subassembly and/or AlN substrate. The etching process can be controlled to change the etch rate (increase or reduce the etch rate), to start the etching process, and/or to stop the etching process after the substrate reaches a predetermined state, e.g. the substrate has been substantially removed from the subassembly or when the substrate reaches a predetermined thickness, e.g., about 50 µm, or when the substrate has been substantially removed in a region of the subassembly. The etch rate can be controlled by changing the concentration and/or temperature of the etchant. For example, as the thickness of the AlN approaches a predetermined thickness (or approaches substantial substrate removal), the etch rate may be slowed by adding water to the chamber to decrease concentration of the etchant. Alternatively or additionally, the temperature of the etchant may be reduced to slow the etch rate. In some implementations, stopping the etching process may be accomplished by removing the subassembly from the etchant, by either manual or automatic removal techniques.

Measuring the thickness of the subassembly and/or aluminum nitride substrate may be accomplished by various processes including mechanical, electrical, chemical, and/or optical techniques. For example, in some configurations, measuring the thickness of the AlN substrate may be accomplished by optical techniques that use electromagnetic radiation. These techniques can involve a source that directs the electromagnetic radiation toward the subassembly and a detector configured to detect electromagnetic radiation that is diffracted, reflected and/or transmitted by the subassembly. For example, the thickness of the subassembly and/or AlN substrate may be measured using techniques such as x-ray diffraction, ellipsometry, and/or interferometry. In some configurations, the measurement unit can arranged so that the thickness measurements are accomplished in situ during the etching process. In other configurations, the thickness measurements are made ex situ by removing the subassembly from the etching process, making a measurement, and returning the subassembly to the etching process.

Figure 3:
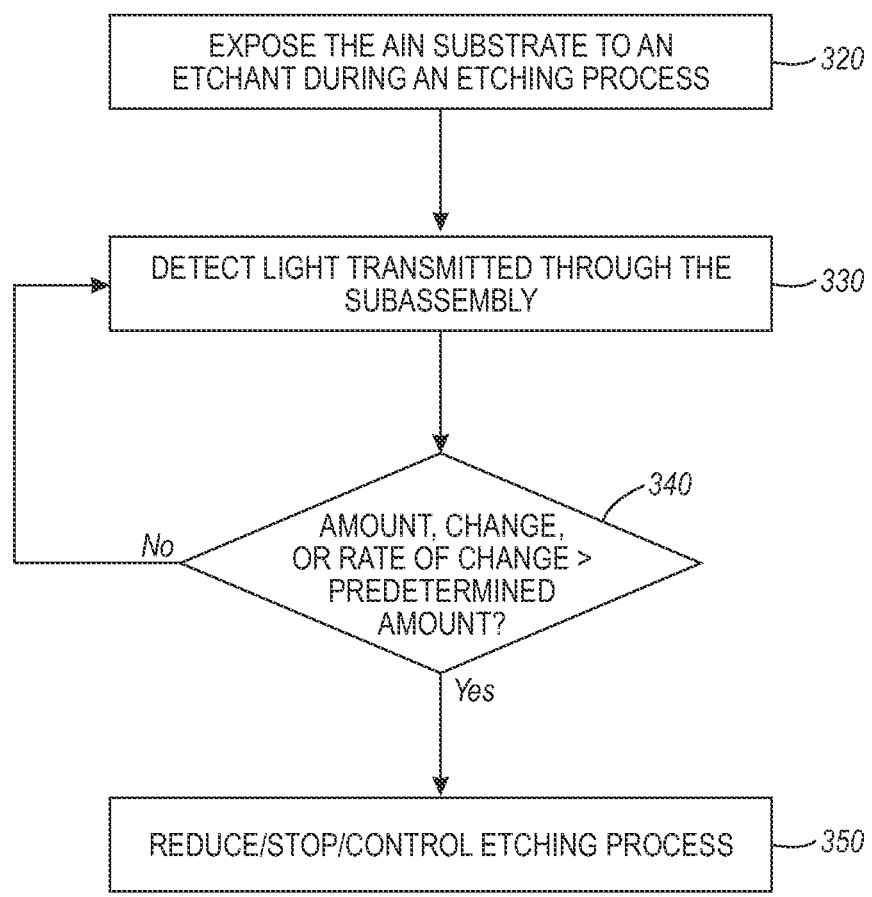
FIG. 3 is a flow diagram that illustrates measuring the thickness of an AlN substrate using light that is transmitted through the subassembly in accordance with some embodiments.

In some configurations, measuring the thickness of the AlN substrate involves detecting light that is transmitted through the subassembly. The wavelength range of the light used for such a measurement is in a range that is substantially absorbed by the bulk AlN substrate and is transmitted at least to some extent by the epitaxial layers. As illustrated by the flow diagram of FIG. 3, when the etching process 320 first begins, the AlN substrate is relatively thick and opaque to the light. The light transmitted through the AlN substrate (if any) is detected 330 during the etching process. As the AlN substrate is etched away, the AlN substrate becomes thin enough to allow transmission of the light through the substrate. An amount of light transmission through the AlN substrate a change in light transmission compared to a baseline amount measured earlier in the etching process and/or a rate of change in light transmission through the AlN substrate can be detected 340 and may be used to control 350 the etching process.

Figure 4:
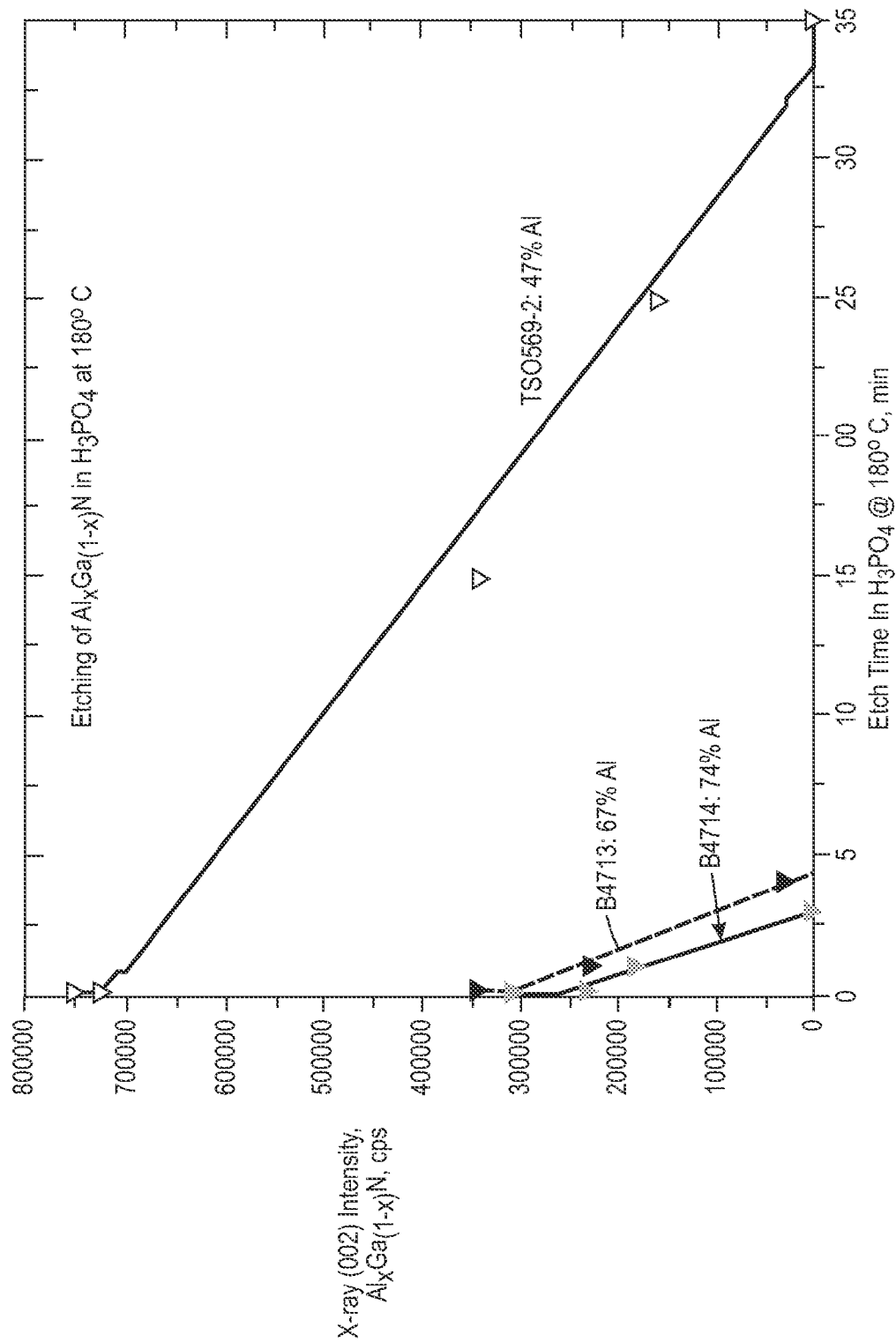
FIG. 4 graphically illustrates etch times of epitaxial Al$_x$Ga$_{(1-x)}$N layers in phosphoric acid.
Figure 5:
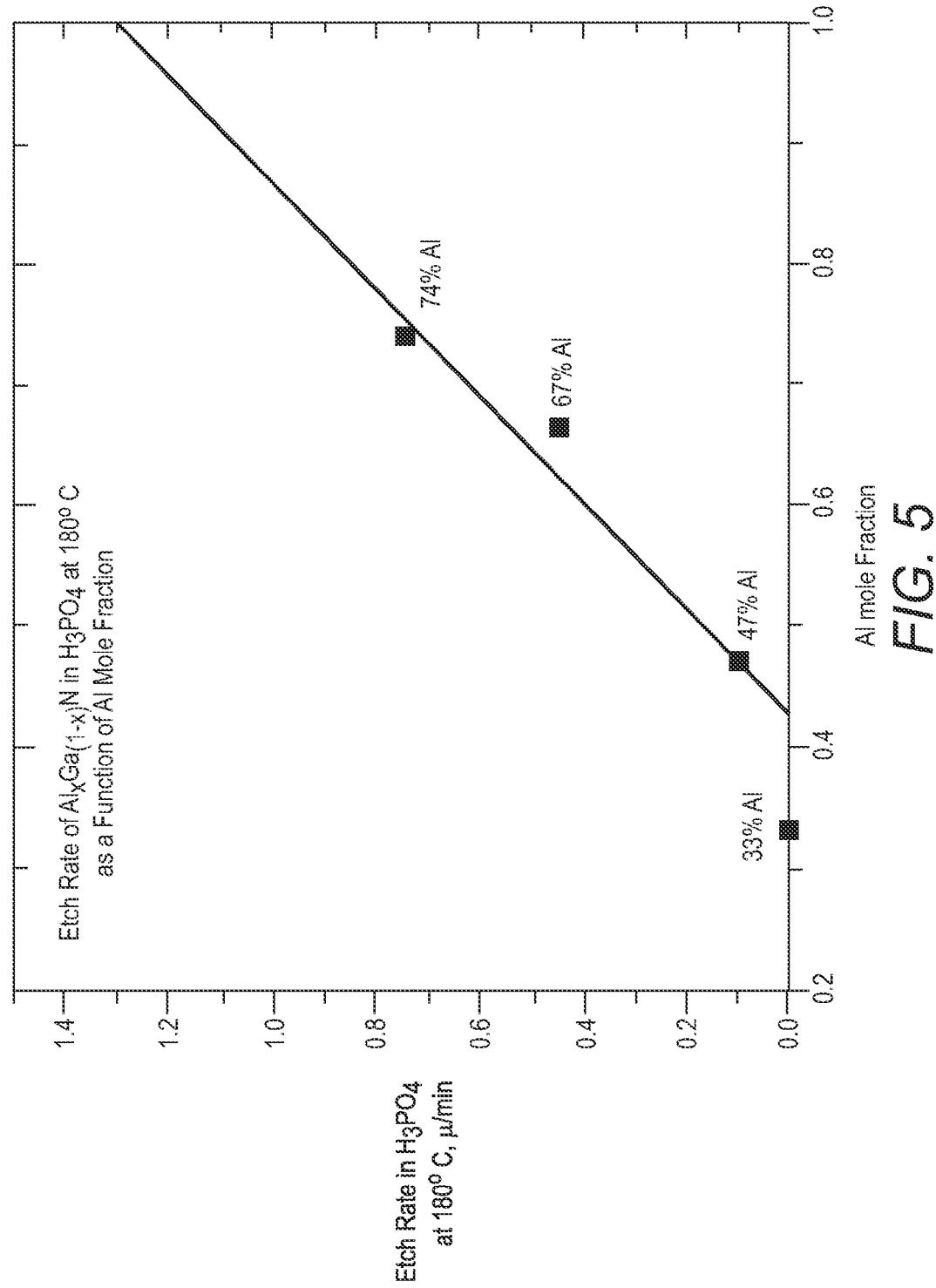
FIG. 5 is a graph of the etch rate of Al$_x$Ga$_{(1-x)}$N layers in phosphoric acid.

The etch rate of $Al_xGa_{(1-x)}N$ materials, where x=0 to 1, varies as a function of aluminum content. The graphs of FIGS. 4 and 5 illustrate etch times and etch rate, respectively, of epitaxially grown AlGaN layers as a function of molar fraction of aluminum. For each sample, the thickness of the AlGaN layer being etched was monitored by periodically taking the sample out of the chemical bath etchant and performing x-ray scans to determine the x-ray signal intensity of the AlGaN layer. FIG. 4 shows etch times of epitaxial $Al_xGa_{(1-x)}N$ layers having a thickness of 2.4 µm etched in phosphoric acid ($H_3PO_4$) at a concentration of 91% and temperature of 180° C. The layers of AlGaN having aluminum molar fraction of 74% or 67% were substantially removed in less than 5 min., whereas the AlGaN layer having 47% aluminum mole fraction took over 30 min. to remove.

Figure 6:
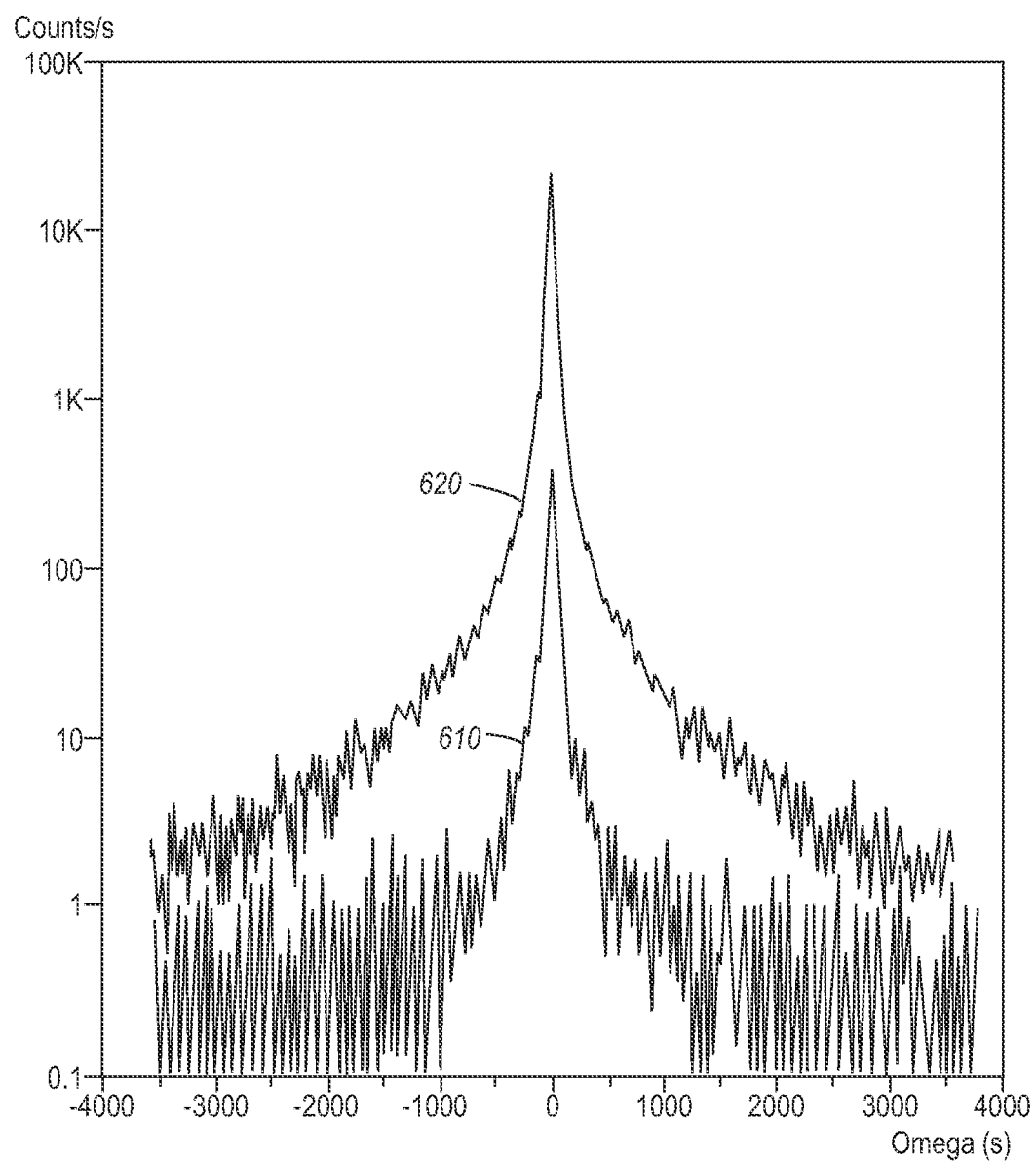
FIG. 6 is an example of the x-ray diffraction measurement of a sample subassembly before and after removal of the substrate using methods disclosed herein.

FIG. 5 shows a graph of the etch rate of epitaxially grown $Al_xGa_{(1-x)}N$ in $H_3PO_4$ at the concentration of 91% and temperature of 180° C. as a function of aluminum mole fraction. The graph shows that the etch rate increases with increasing aluminum molar fraction. FIG. 6 is an example of the x-ray diffraction measurement of a sample subassembly before 610 and after 620 removal of the substrate. As described in more detail below, in some embodiments, a layer of relatively high molar fraction epitaxially grown AlGaN can be used as an interstitial layer to remove a bulk AlN substrate.

Figure 7:
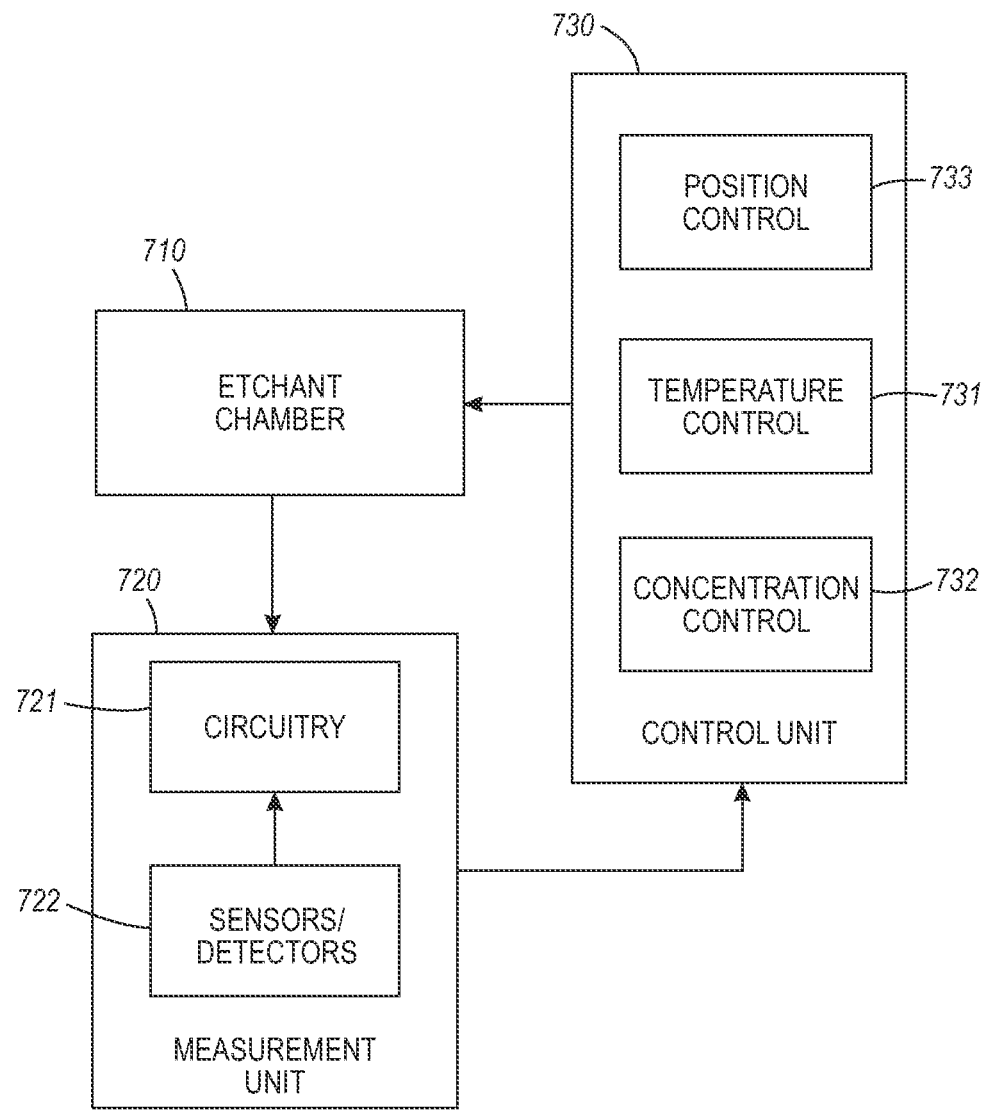
FIG. 7 is a block diagram of an apparatus that can be used to remove an AlN substrate from a subassembly by wet etching in accordance with some embodiments.

FIG. 7 is a block diagram of an apparatus that can be used to remove an AlN substrate from a subassembly by wet etching. The apparatus includes an etchant chamber 710 configured to contain the etchant and to hold the subassembly being etched. The apparatus optionally includes a measurement unit 720 configured to generate a signal indicative of the thickness of the AlN substrate and/or the thickness of the subassembly that includes both the AlN substrate and the one or more epitaxial layers. The signal is generated by the measurement unit 720 during the etching process and may reflect a series of thickness measurements. The signal may be used by a control unit 730 to control one or more aspects of the etching process.

Figure 8:
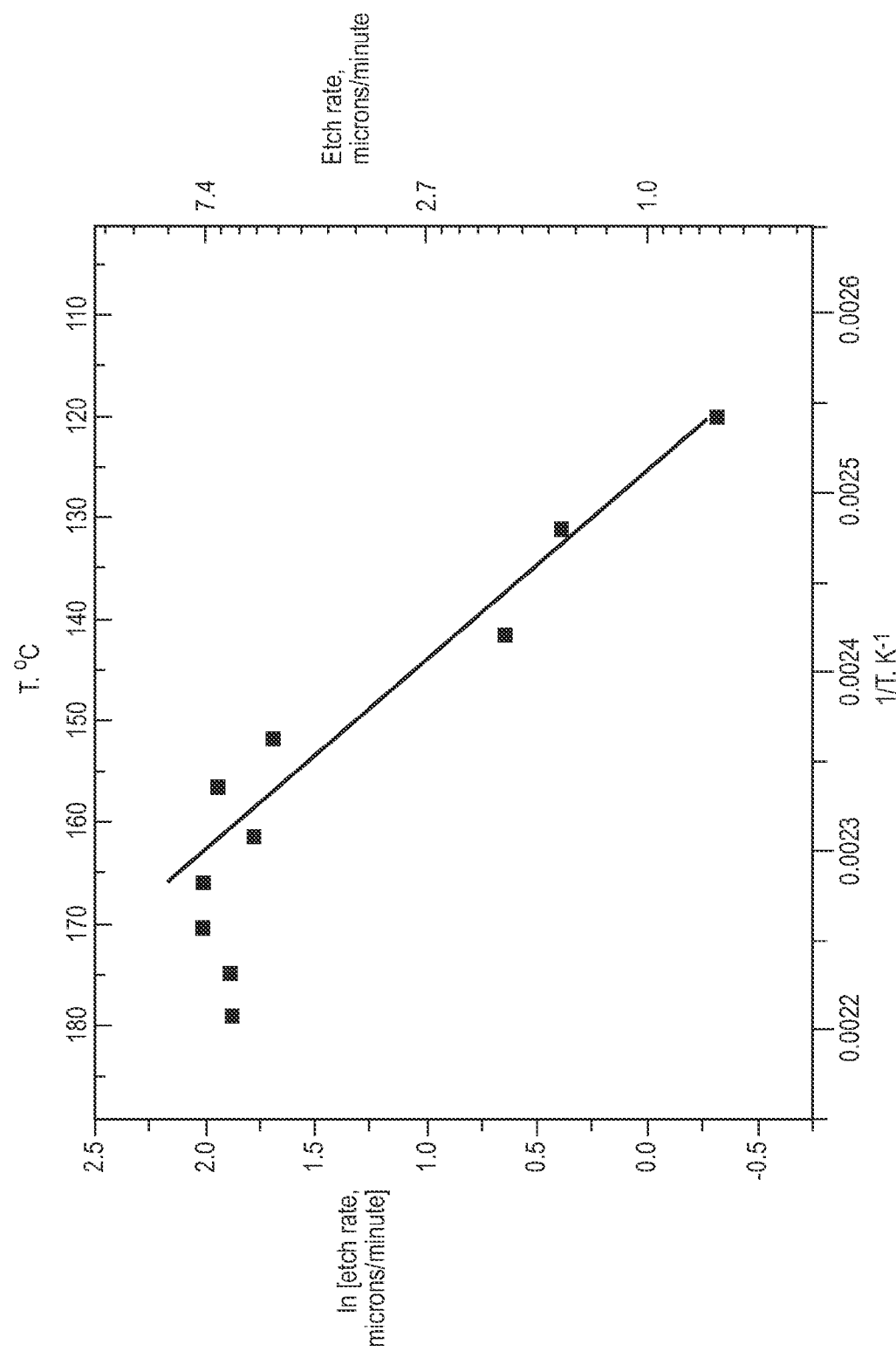
FIG. 8 illustrates the etch rate of bulk AlN as a function of temperature, the bulk AlN etching accomplished using methods disclosed herein.

Control of the etching process may be accomplished by one or more subunits of the control unit 730 that are arranged to control various aspects of the etching process. For example, the subunits 731, 732, 733 may control the temperature of the etchant, the concentration of the etchant, and/or the position of the sample. The etch rate of the subassembly may be controlled by changing one or more of these and/or other parameters. The concentration control subunit 732 can be configured to maintain or change the concentration of the etchant by adding more water to the chamber 710 or by allowing the water in the chamber 710 to be reduced, e.g., by not replacing water that evaporates during boiling. The temperature control subunit 731 may include one or both of heaters and coolers that heat and/or cool the etchant. Cooling the etchant and/or decreasing the concentration of the etchant slows the etch rate. Increasing the temperature of the etchant and/or increasing the concentration increases the etch rate up to a point. However, the etch rate can be dependent on hydrolysis of the AlN substrate surface. The etch rate may be limited when the concentration of the etchant becomes too high and the amount of water in the etchant is insufficient to allow hydrolysis of the surface to occur. FIG. 8 illustrates the etch rate of bulk AlN as a function of temperature. As will be appreciated, the etch rate appears to level off for temperatures greater than about 160 degrees C. which corresponds to a concentration of about 85%. This leveling off may be due to insufficient water to hydrolyze the surface of the substrate.

In some configurations, the temperature and/or concentration control subunits 731, 732 may be set up to maintain the temperature and/or concentration of the etchant within predetermined ranges. Substrate removal may include monitoring the etch solution. If the temperature of the phosphoric acid is maintained at the boiling point, loss of water during boiling reduces the rate of hydrolysis of the AlN and thus reduces the etch rate. The boiling point of phosphoric acid varies with the concentration of the acid. For example, commercially available phosphoric acid has an acid concentration of about 85% and boils at about 158° C. As water is lost during boiling, the concentration of the acid and the boiling point increase. For a controlled etch rate the concentration and/or temperature of the etchant may be maintained within predetermined ranges, e.g., concentration range of about 87% to about 96% and a temperature range of 160° C. to 210° C. To maintain a relatively constant acid concentration, the lost water can be replaced, e.g., either with a reflux condenser or an automated drip system.

Figure 9:
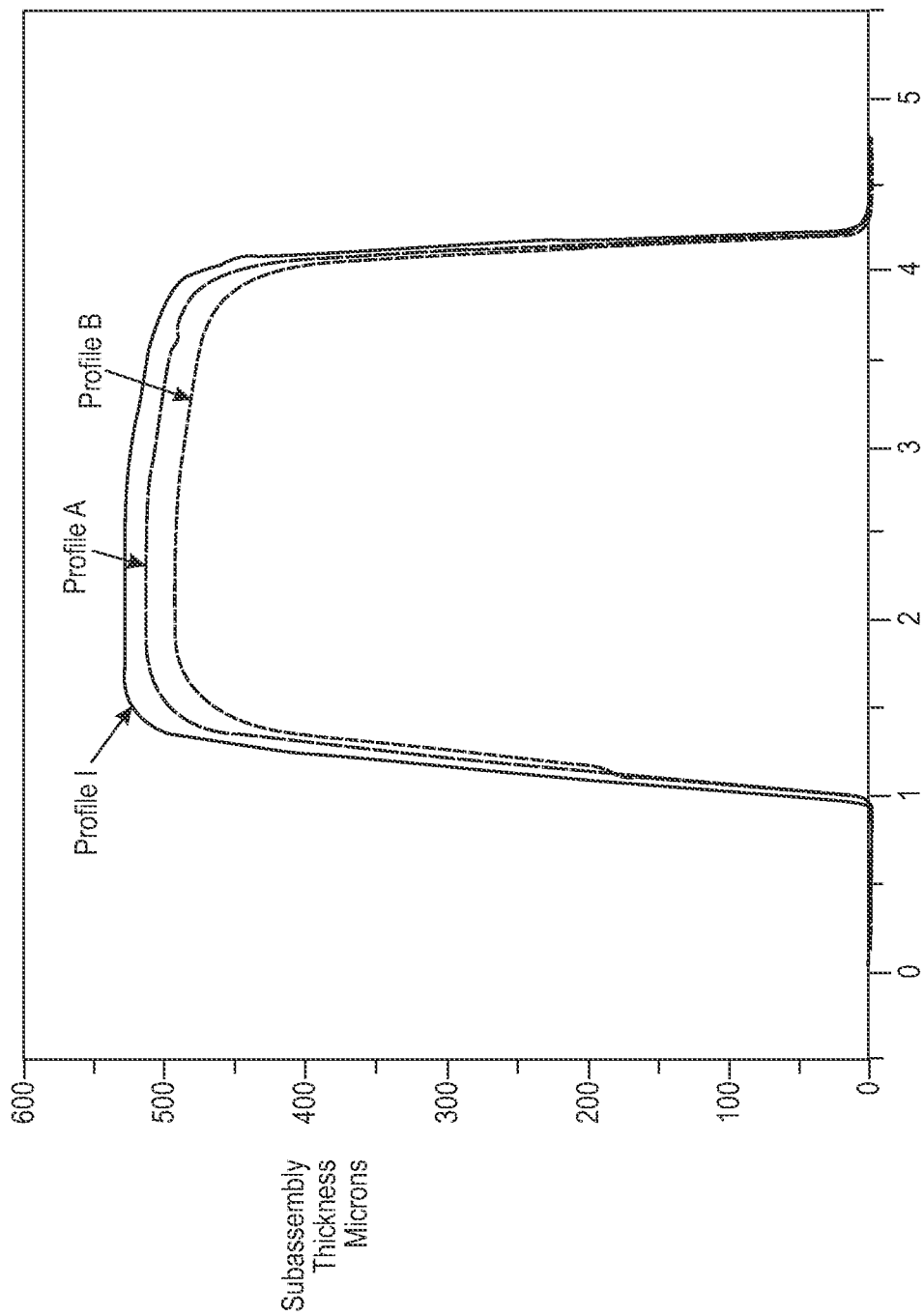
FIG. 9 shows superimposed graphs of profilometer measurements of the subassembly.

The measurement unit 720 includes one or more sensors or detectors (shown as sensors/detectors 722 in FIG. 7) coupled to suitable processing circuitry 721 configured to process signals from the sensors/detectors. During the etching process, the sensors/detectors 722 detect changes in characteristics of the subassembly and/or the etchant that are related to the thickness of the AlN substrate and/or the subassembly. As previously mentioned, the measurement unit 720 can use various techniques to generate a signal indicative of thickness. These techniques may comprise sensing optical, mechanical, chemical, or electrical parameters of the AlN substrate, the subassembly and/or the etchant during the etching process. As an example, mechanical measurement of the thickness of the subassembly may be made using a profilometer. For this example, the profilometer probes are the sensors of the measurement unit. The subassembly may be measured several times during the etching process. FIG. 9 shows superimposed graphs of profilometer measurements of the subassembly. Thickness Profile I is the starting profile before the AlN substrate of the subassembly was etched. After the starting profile (Profile I) was acquired, the subassembly was placed in the etchant bath for a first period of time, then removed and the thickness profile was remeasured. Profile A represents the thickness of the subassembly after etching for the first period of time. After Profile A was acquired, the subassembly was etched for a second period of time. After the second period of time, the thickness of the subassembly was remeasured as shown in Profile B. The successive Profiles I, A, B show the progress of the etching process after the first and second time periods.

Electrical characterization of the subassembly may be used to generate the signal indicative of thickness. For example, in some embodiments, the sensors may comprise electrical contacts configured to make electrical contact to surfaces or portions of the subassembly. The electrical contacts are coupled to circuitry configured to implement one or more electrical characterization processes. The electrical characterization of the subassembly may include one or more of resistance/conductance measurements, capacitance measurements, current-voltage characterization, and or other characterizations. A decrease in the thickness of the subassembly produces detectable changes in the electrical characterization of the subassembly.

The measurement unit may comprise chemical sensors and associated circuitry configured to detect chemical changes in the subassembly and/or in the etchant. The chemical sensors can be positioned on the subassembly, and/or in the etchant chamber, e.g., in the etchant bath. In some cases, the chemical sensors and associated circuitry are configured to measure a concentration of ions in the etchant bath. This concentration may change during the etching process as a function of the amount of AlN that becomes dissolved in the etchant. Thus, ion concentration as detected by the chemical sensors may be used to generate the signal indicative of the thickness of the AlN substrate. In some configurations, it may be helpful to position the chemical sensors near e.g., within a few mm, of the subassembly to increase the sensitivity to ion concentration at the surface being etched.

The measurement unit can use light transmitted through the subassembly to generate a signal indicative of the thickness of the substrate. In these implementations, the measurement unit may include a light source arranged to direct light toward the subassembly and a detector arranged to detect the transmitted light. The light source may comprise one or more lamps, LEDs, and/or lasers emitting UV, visible, infrared or broadband light. The light directed toward the subassembly includes a wavelength range that is substantially optically absorbed by the AlN substrate and is not substantially absorbed by the epitaxial layers of the subassembly. For example, for a subassembly comprising a bulk AlN substrate and AlGaN epitaxial layers, the measurement unit may include a light source, e.g., LED, that emits light in a wavelength range from about 200 nm to about 365 nm and a detector that detects the light in this range. In some configurations, the light source may emit and the detector may detect light in a wavelength range of about 250 nm to about 300 nm.

In some cases, the light source is configured to output light having a range of wavelengths and the detector is configured to characterize the spectral response of the subassembly over the wavelength range. Changes in the spectral response may be used to control the etch process.

Figure 10:
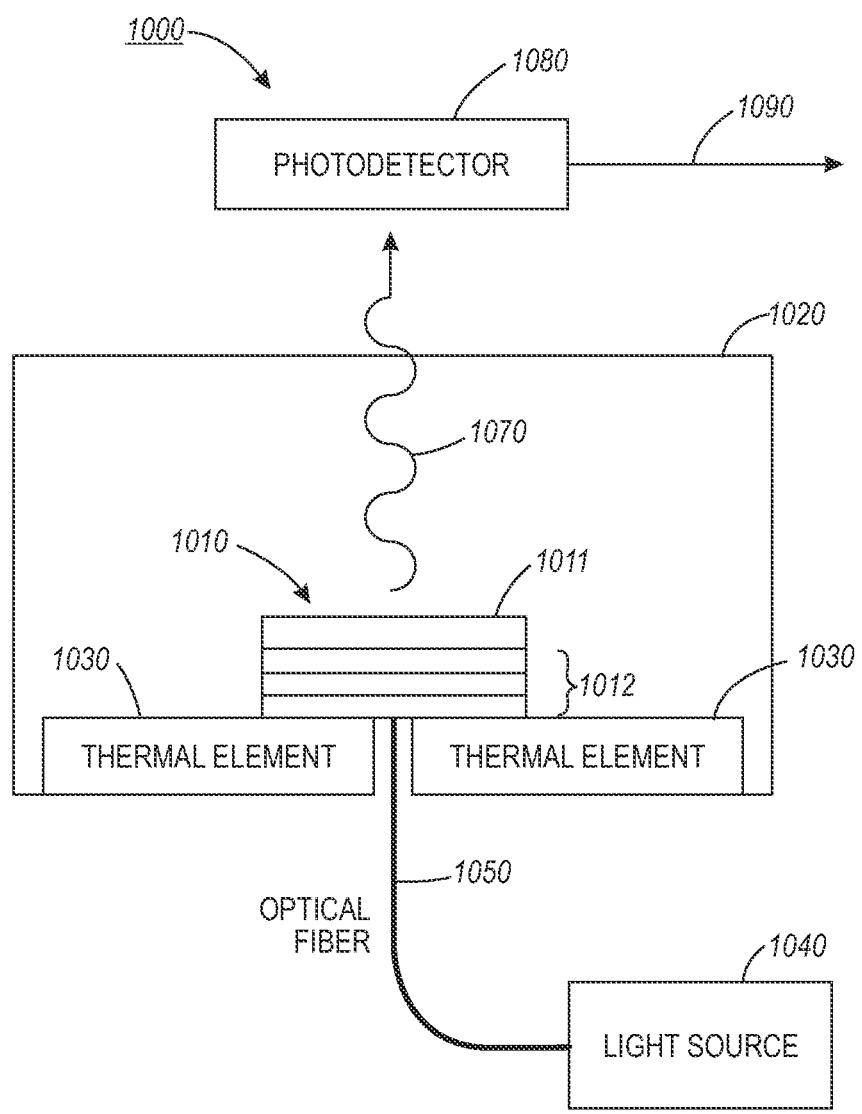
FIG. 10 is a block diagram of an apparatus that uses light to generate a signal indicative of the thickness of the AlN substrate in accordance with some embodiments.

FIG. 10 is a block diagram of an apparatus 1000 that uses light to generate the signal indicative of thickness. In the example configuration of FIG. 10, a subassembly 1010 including a bulk AlN substrate 1011 and one or more epitaxial layers 1012 on the AlN substrate 1011 is disposed in an etchant chamber 1020. Thermal elements 1030, e.g., heaters and/or coolers, can be disposed in, on, or about the chamber 1020 for controlling the temperature of the etchant during the etching process. Additionally or alternatively, the apparatus 1000 may include structures (not shown) configured to control the concentration of the etchant in the chamber. A light source, e.g., a UV LED, is arranged so that light is directed towards the subassembly. As illustrated in FIG. 10, the light may be directed towards the subassembly 1011 through an optical fiber 1050. Prior to the etching process, the light from the light source 1040 may be substantially blocked by the bulk AlN substrate 1011, but substantially transmitted by the epitaxial layers 1012. As the substrate 1011 becomes thinner, the light is able to be transmitted through the subassembly 1010. The transmitted light 1070 is detected by a photodetector 1080. In response to the light 1070 transmitted through the subassembly 1010, the photodetector 1080 generates an output signal 1090 indicative of the thickness of the AlN substrate 1011.

Figure 11:
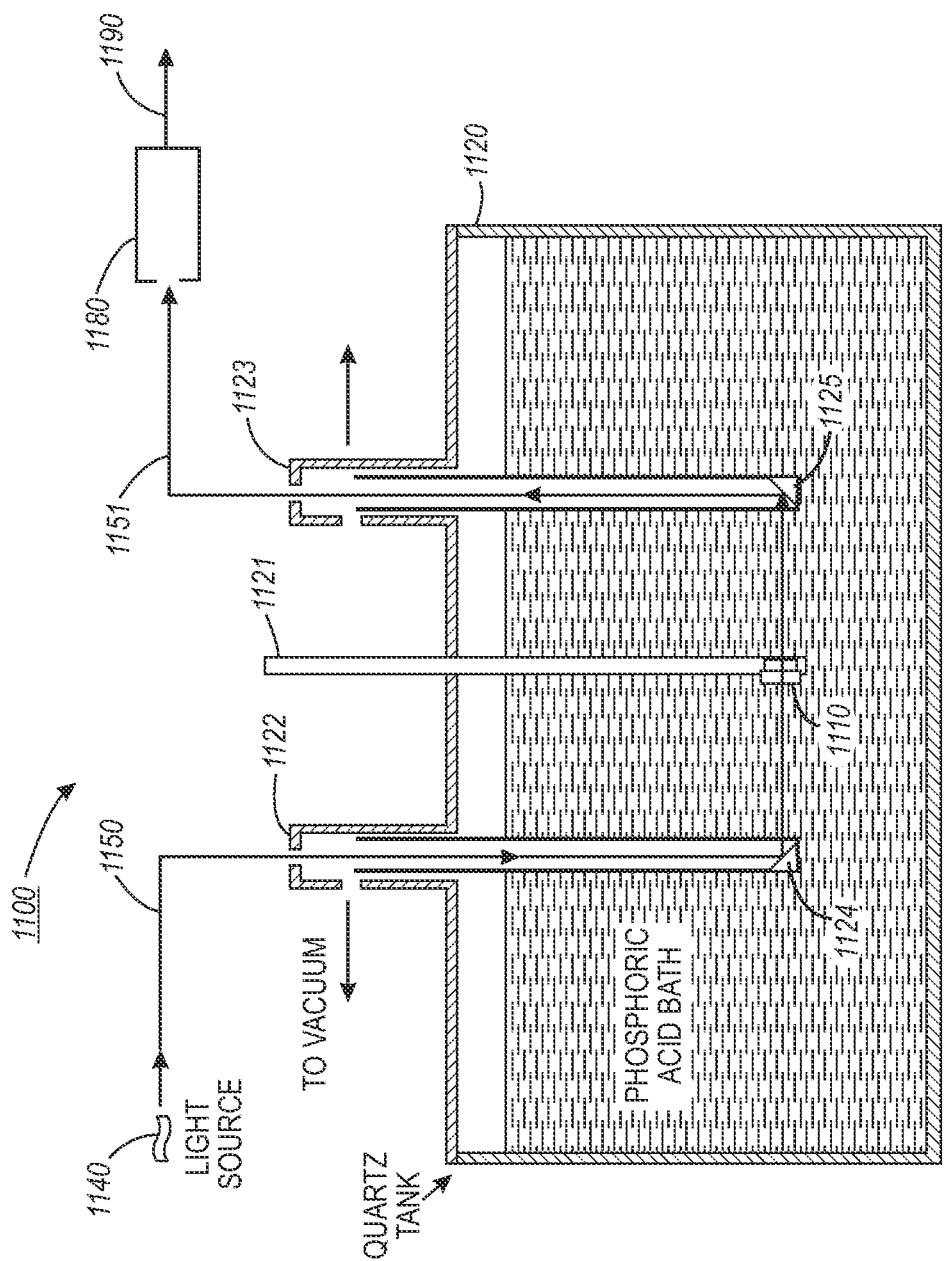
FIG. 11 illustrates an apparatus that uses light to generate a signal indicative of the thickness of the AlN substrate in accordance with some embodiments.

Another example of an apparatus 1100 that uses light to detect the thickness of the AlN substrate during the etching process is shown In FIG. 11. The apparatus 1100 in this embodiment includes an etchant chamber comprising a quartz tank 1120 which contains the phosphoric acid bath. The subassembly 1110 including an AlN substrate and one or more epitaxial layers formed thereon is positioned and held in the tank 1120 by the sample holder 1121. The apparatus 1100 includes two ports 1122, 1123 each coupled to a vacuum. In this example, the ports 1122, 1123 comprise closed ended evacuated quartz tubes. Light from the light source 1140 is guided by a first optical fiber 1150 through the first port 1122 and is directed by a first mirror 1124 towards the subassembly 1110. Light transmitted through the subassembly 1110 is directed by a second mirror 1125 via a second optical fiber 1151 through the second port. A photodetector 1180 is arranged to detect the light transmitted through the subassembly 1110. In response to the detected light, the photodetector 1180 generates a signal 1190 indicative of the thickness of the AlN substrate.

Figure 12:
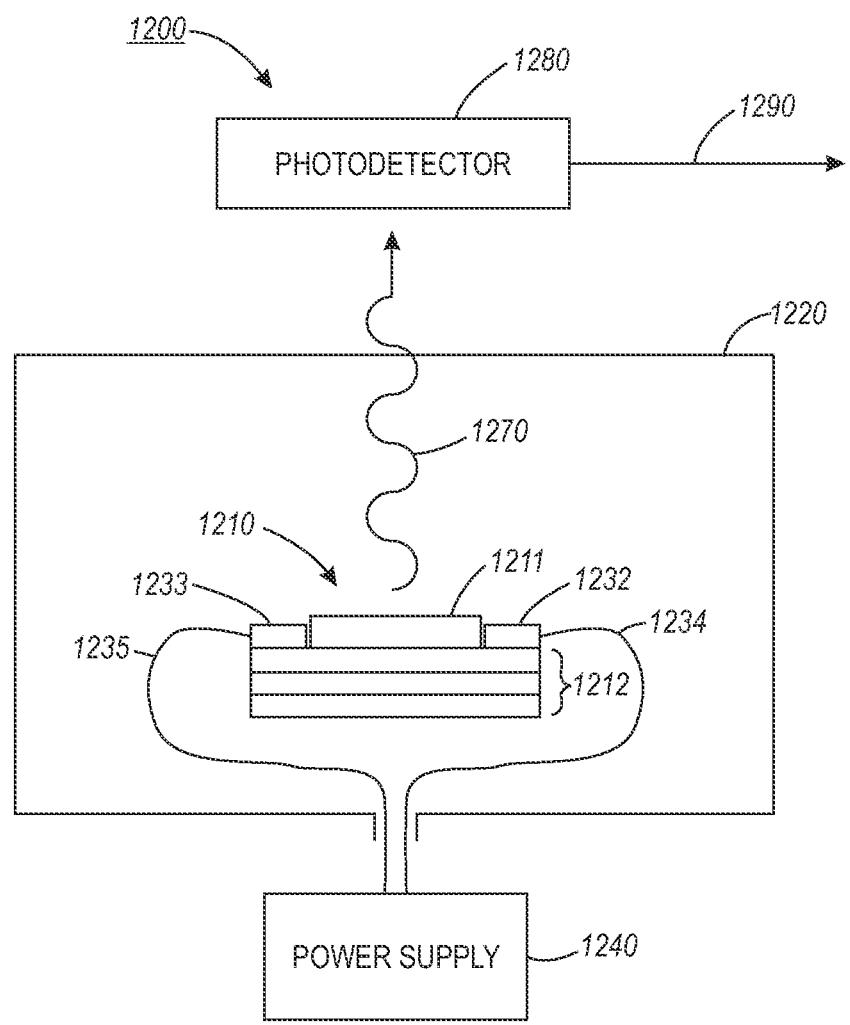
FIG. 12 is a block diagram of an apparatus that uses light generated by the subassembly to generate a signal indicative of the thickness of the AlN substrate in accordance with some embodiments.

In some implementations, the epitaxial layers of the subassembly may form a light emitting device such as an LED. In these implementations, the light emitting device may be the light source for the light that is used in generating the signal indicative of the thickness of the AlN substrate. FIG. 12 illustrates an apparatus 1200 that uses the epitaxial layers 1212 of the subassembly 1210 to generate the light 1270 that is used to measure the AlN substrate thickness. The apparatus 1200 is similar in some respects to FIG. 10, however the external light source and optical fiber shown in FIG. 10 are not used in the implementation illustrated in FIG. 12. The subassembly 1210 is disposed within the etchant chamber 1220 and includes layers 1212 which are epitaxially grown on the AlN substrate 1211. The epitaxial layers 1212 form a light emitting device. The apparatus 1200 includes electrical contacts 1232, 1233 that make contact to the light emitting device 1212 and leads 1234, 1235 that connect the electrical contacts 1232, 1233 to a power supply 1240. When the light emitting device 1212 is energized by the power supply 1240 via the leads 1234, 1235 and electrical contacts 1232, 1233, the light emitting device 1212 produces light 1270 that is transmitted through the AlN substrate when the substrate becomes sufficiently thin to transmit the light 1270. As the AlN substrate 1211 is etched, it transmits an increasing amount of light 1270 that is detected by the photodetector 1280. The photodetector 1280 generates a signal 1290 indicative of the thickness of the AlN substrate.

Figure 13:
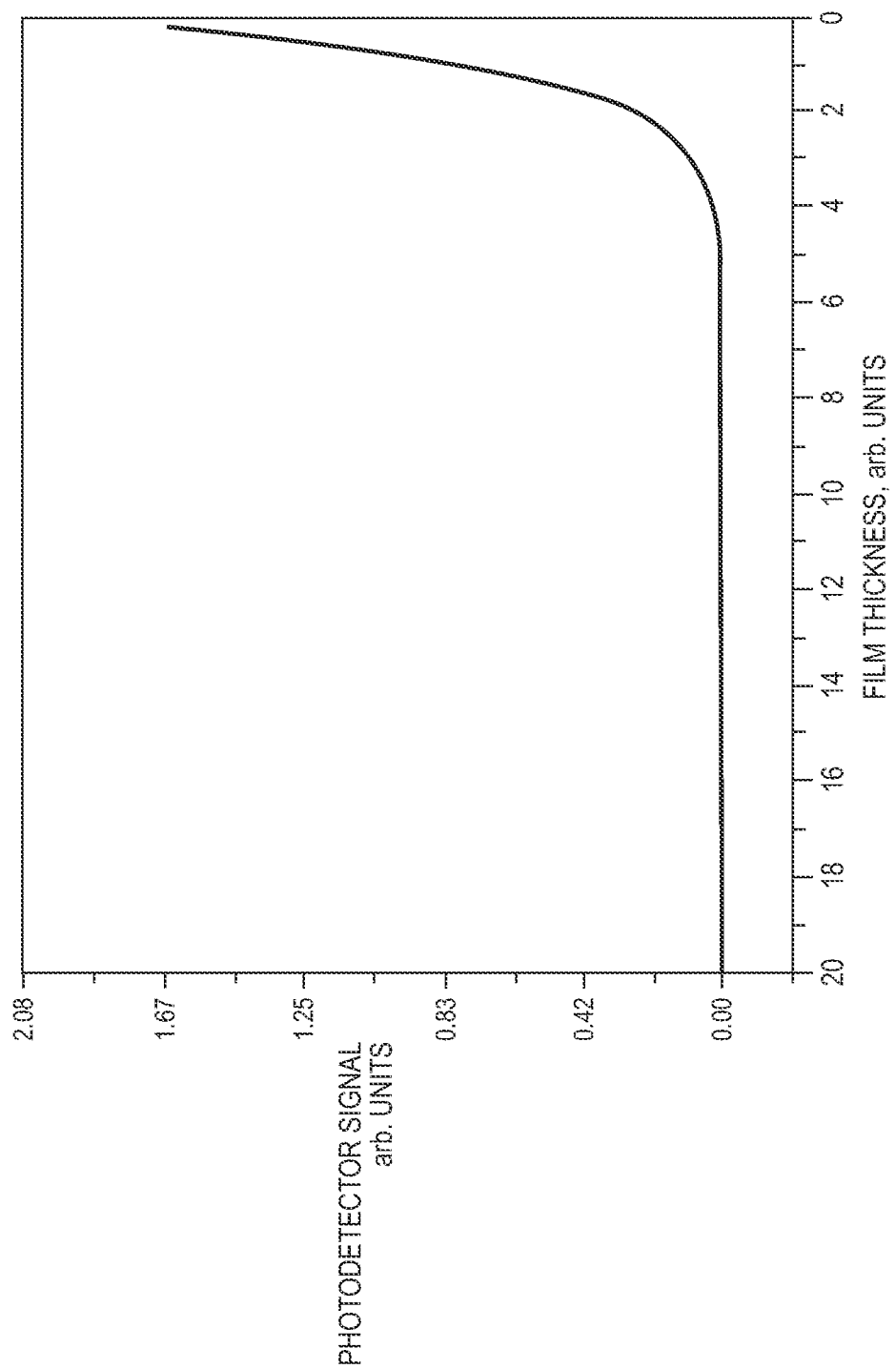
FIG. 13 depicts an example of a signal generated by the photodetector as a function of the thickness of the AlN layer.

FIG. 13 shows an example of an idealized signal, e.g., generated by a photodetector, that indicates the thickness of the AlN substrate. Initially, the AlN substrate is substantially optically absorbing to the light transmitted toward the AlN substrate. When the etching process first begins, much of the light directed to the AlN substrate is absorbed by the substrate and does not escape from the subassembly. The thickness signal remains at a nominal value until the thickness of the AlN substrate becomes thin enough to transmit some light through the AlN layer. When the aluminum nitride substrate becomes thin enough to transmit light, the thickness signal begins to increase as more and more AlN is etched from the substrate. The change in the signal can be quite rapid when the thickness of the AlN substrate achieves a value that transmits a substantial amount of light.

In some cases, the signal generated by the measurement unit can be used to control the etching process. For example, the control unit may monitor the signal until the point that a rapid change is detected. At that point, the control unit may operate to change the etch rate, e.g., slow down or stop the etch process. The signal generated by the measurement unit may be in used in conjunction with other information to control the etching process. For example, in addition to the signal generated by the measurement unit, the control unit may take into account factors such as the duration of the etching process, the concentration of the etchant in the chamber over the duration of the etching process, and/or the temperature of the etchant over the duration of the etching process. The control unit can control the operation of the thermal units, e.g. heaters or coolers, and/or can control the concentration of the etchant to change the rate of the etching process.

Various types of light emitting devices may be formed using the processes for bulk AlN substrate removal described herein. Removal or thinning of the bulk AlN substrate is particularly useful for UV LEDs and UV laser diodes that emit light in the wavelength range of about 200 nm to about 365 nm or about 250 nm to about 320 nm. Although the use of bulk AlN substrates in the formation of these light emitting devices allows the growth of low defect epitaxial layers in the device structures, the AlN substrate substantially absorbs light emitted from the active region towards the substrate side of the device. Thus, removal of the substrate allows increased light emission from the substrate side (back side) of the device. In some devices, the upper layers of the light emitting device on the opposite side of the active layer from the substrate (i.e., layers on the front side of the device) may be optically absorbing at the wavelength of light generated by the device. Thus, it is helpful if light generated by the device can be emitted through the substrate side which is made possible by removal of the AlN substrate.

Figure 14:
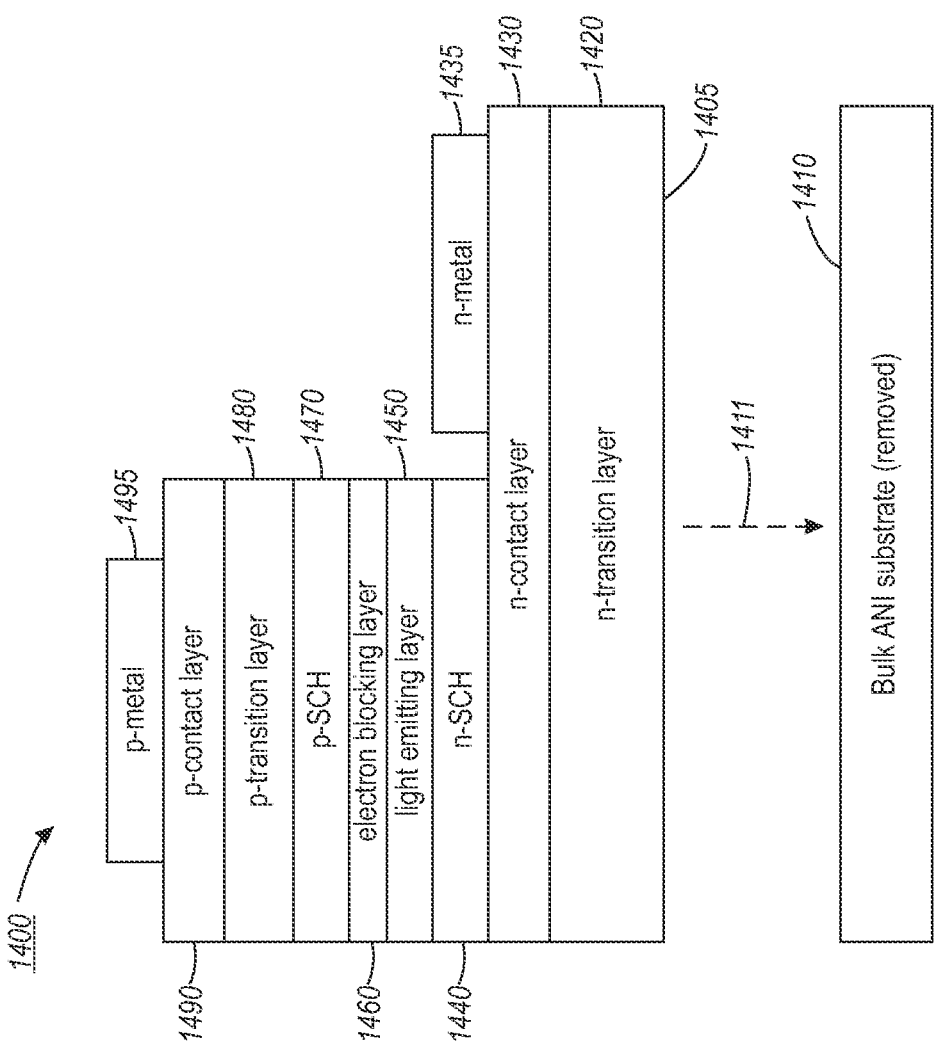
FIG. 14 shows a ultraviolet (UV) light emitting diode (LED) that is initially grown on a bulk AlN substrate which is subsequently removed in accordance with embodiments disclosed herein.

FIG. 14 shows an embodiment of an UV LED 1400 that is initially grown on a bulk AlN substrate 1410. The growth of the epitaxial layers may be accomplished, for example, using metal organic chemical vapor deposition (MOCVD), by hydride vapor phase epitaxy (HYPE) and/or by any combination of these techniques. The bulk AlN substrate 1410 may be subsequently removed or thinned as indicated by arrow 1411. In some cases, the AlN substrate 1410 may be removed. In some cases, the AlN substrate 1410 may be thinned, e.g., thinned beyond what is possible using mechanical techniques, to a thickness of about 50 μm or less. The UV LED heterostructure 1400 illustrated in FIG. 14 may be grown by metal organic vapor epitaxy to include the following:

an n-side $Al_xGa_{1-x}N$ transition region 1420;
an n-doped $Al_{0.74}Ga_{0.26}N$ n-contact layer 1430;
an n-side $Al_{0.74}Ga_{0.26}N$ separate confinement heterostructure (SCH) 1440;
a multiple quantum well (MQW) light emitting layer 1450, e.g., designed to emit at a central frequency of $\lambda=250$ nm;
an electron blocking layer 1460;

a p-side AlGaN SCH 1470, a p-doped AlGaN transition region 1480; and
a p-doped GaN contact layer 1490.

The n-side $Al_xGa_{1-x}N$ transition region 1420 includes an initial surface of epitaxial growth 1405 formed on the AlN substrate 1410. In some configurations, the n-side transition region 1420 is a series of short period superlattices with average Al compositions ranging from x equal to about 0.90 to x equal to about 0.80. In some configurations, the transition region 1420 may be a linearly graded alloy with x ranging from about 100% to about 74%. The n-contact layer 1430 is the contact layer for the n-contact 1435 and may be about 1.9 µm thick, for example. The MQW light emitting layer 1450 can comprise 3 pairs of 6 nm-thick $Al_{0.68}Ga_{0.32}N$ barriers and 2 nm-thick $Al_{0.65}Ga_{0.35}N$ wells. The electron blocking layer (EBL) 1460 may be about 83% aluminum and about 20 nm thick. The p-SCH 1470 can have an aluminum composition, x, ranging from about 0.3 to about 0.74. The p-transition layer 1480 can be a superlattice or can be an alloy with x ranging from about 0.3 to about 0.74. The p-contact layer 1490 comprises GaN and is a contact layer for the p-metal contact 1495. The described structure is only an example. The number of layers, composition of layers, the actual heterostructure design, and/or the growth procedure can vary significantly. In particular, the layers can contain indium to form InGaN or InAlGaN instead of AlGaN.

The LED is initially grown on a bulk AlN substrate and the substrate is subsequently removed or thinned. This process produces a defect density at the initial surface of epitaxial growth in the AlGaN transition layer to be relatively low, e.g., in the range of about $10^{10}$ cm$^{-3}$ to about $10^3$ cm$^{-3}$ such as about $10^8$ cm$^{-3}$ or $10^7$ cm$^{-3}$. Thus, the device retains the high-quality epitaxial growth afforded by substantial lattice matching to the AlN substrate but can also allow substantial light transmission through the substrate side of the device.

For example, an AlGaN n-transition layer having Al molar fraction of less about 70% to 80% that is epitaxially grown on the bulk AlN substrate would be closely lattice matched to the substrate. In this scenario, the AlGaN n-transition layer is initially strained to achieve a close match to lattice constant of the bulk crystalline AlN with low defect density. When the AlN substrate is removed, the lattice of the n-transition layer relaxes, but the low defect density is retained.

Figure 15:
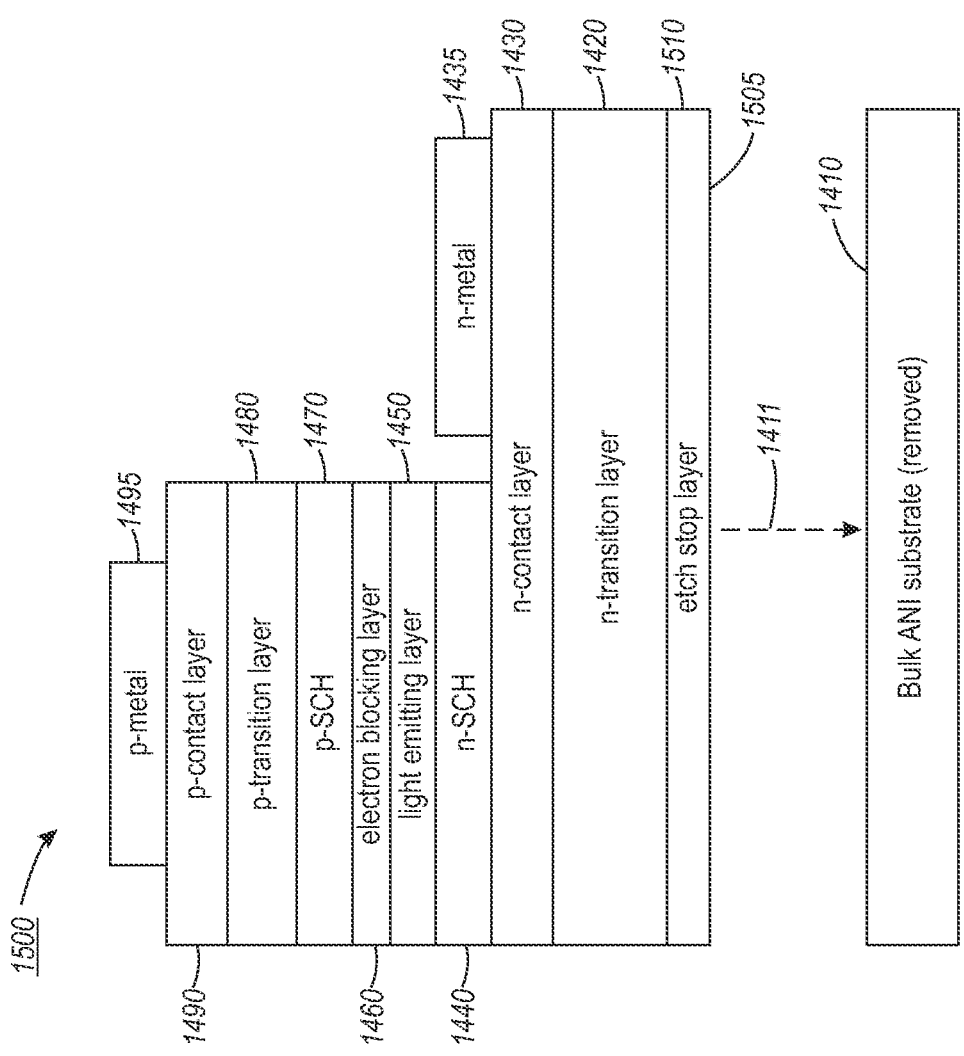
FIG. 15 shows a ultraviolet light emitting diode that includes an etch reduction layer in accordance with some embodiments.

FIG. 15 illustrates an LED that is similar in some respects to the LED 1400 of FIG. 14. The elements identified by reference numbers in FIG. 15 are similar to their counterparts in FIG. 14. The LED 1500 differs from the LED 1400 in FIG. 14 because it includes an etch reduction layer 1510 (also referred to as an etch stop layer) that may be grown between the AlN substrate 1410 and the AlGaN transition layer 1420 prior to the etching. In this example, the etch reduction layer 1510 includes the initial epitaxial surface 1505. The etch reduction layer 1510 may be impervious to the etchant used to etch the AlN substrate, or the etch reduction layer's etch rate in the etchant may be lower than the etch rate of the AlN 1410. The etch reduction layer 1510 may be a relatively thin GaN layer or an AlGaN layer having an Al content (Al molar fraction) in a range of about 70% to about 80% and/or may comprise other suitable materials that provide etch reduction capability, for example.

Substrate removal by, either complete removal or chemically etching to leave a substrate remnant having a thickness less than about 50 µm enables access to the backside of a device for subsequent processing. The backside an amount of surface roughness or texturing is present on the backside of the device after the substrate is removed. In some cases, the texturing may be imparted to the backside of the device due to the substrate removal process. The substrate removal process may be configured to provide texturing of the back side of the device during the substrate removal process The surface roughness resulting from the chemical etch depends on process parameters such as etch bath temperature, acid concentration, etch rate, and/or wafer backside polish. Appropriate process parameters can be chosen to produce desired surface roughness characteristics. In some the backside of the device can be textured after substrate removal, e.g., by ion beam or chemical processing. Texturing can enhance light extraction. In some scenarios, without backside texturing, a substantial amount of emitted light can be trapped in the heterostructure through total internal reflection. Backside texturing scatters the emitted light, frustrates total internal reflection, and enhances light extraction efficiency.

Surface texturing can be patterned by various wet or dry processing techniques. For example, the surface can be textured by immersion in potassium hydride (KOH) solutions. Plasma processing techniques can also be used to roughen the surface. For example the initial epitaxial surfaces 1405, 1505 of LEDs 1400, 1500, may be textured surfaces.

Back side texturing is particularly important in short wavelength UV LEDs because the emitted light becomes increasingly polarized in the TM direction (perpendicular to the surface plane) at shorter wavelengths. Consequently, most of the light is emitted propagating toward the device edges, rather than toward the back side surface. With the substrate removed, features can be patterned to redirect the emitted light toward and through the back side.

Figure 16:
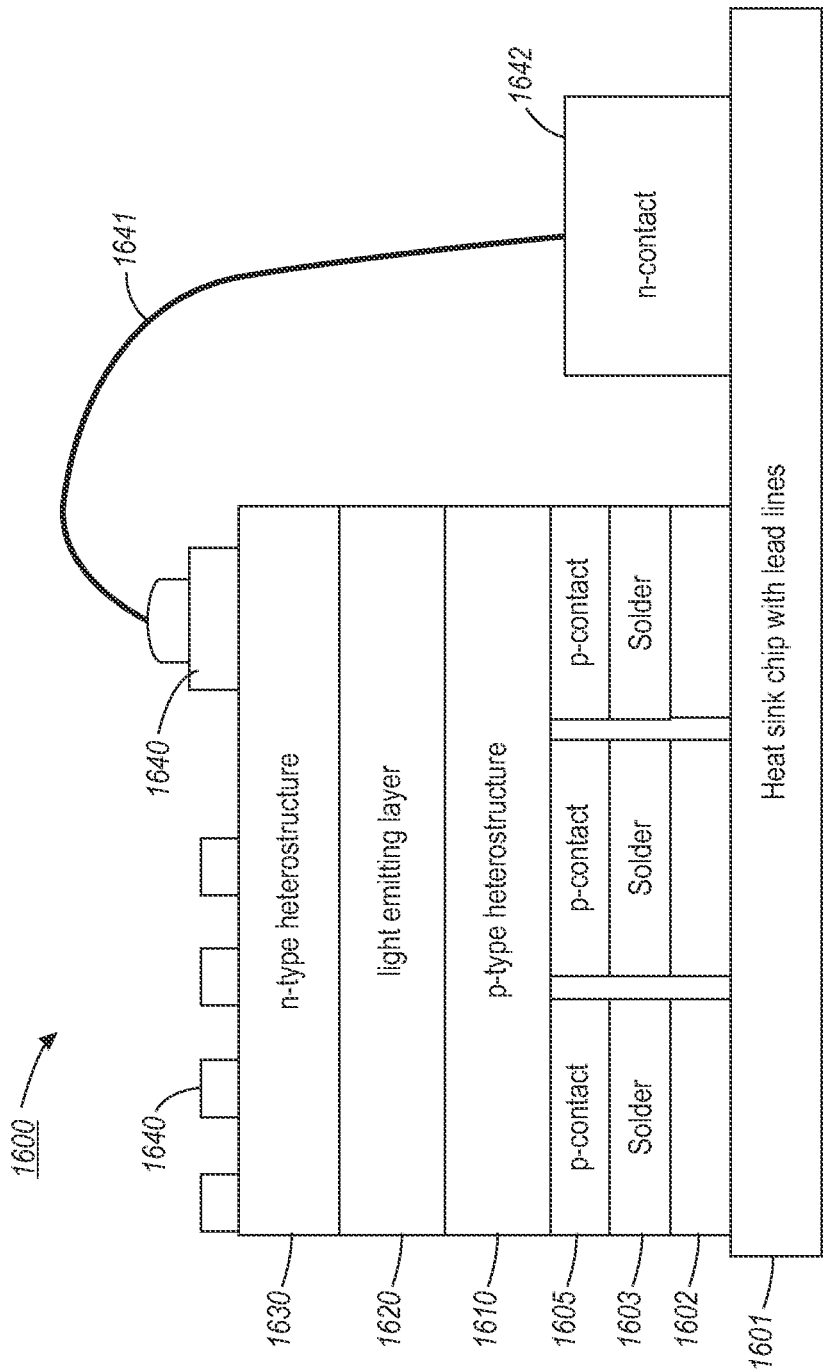
FIG. 16 illustrates a vertical electrical injection LED architecture having back side contacts at the surface where the substrate was removed in accordance with some embodiments.

Substrate removal also enables vertical electrical injection LED architectures. FIG. 16 shows an illustration of such a structure 1600. The LED includes an n-type heterostructure 1630 that includes the initial epitaxial surface 1631. The LED 1600 was grown on a bulk crystalline AlN substrate (not shown in FIG. 16) starting with the initial epitaxial surface of the n-type heterostructure and continuing the epitaxial grown with the light emitting layer 1620 and p-type heterostructure 1610. After formation of the epitaxial layers 1610-1630, the bulk AlN substrate is removed.

P-contacts 1605 of the vertical injection LED 1600 are soldered 1603 to pads 1602 of a heat sink chip 1601. The electrodes 1640 are electrically coupled to the heat sink chip 1601 through one or more leads 1641 and n-contacts 1642. During operation of the device, electrical current is injected from an external supply (not shown) through the p-contacts 1605, through the p-side (p-type heterostructure 1610) through the light emitting layer 1620, through the n-side (n-type heterostructure 1630 and is collected at electrodes 1640 formed on the backside of the device 1600. Removing the electrically insulating AlN substrate allows access to the n-heterostructure layer 1630 for forming the backside contacts 1640.

The vertical injection structure 1600 illustrated in FIG. 16 can be especially beneficial when the material that forms n-type heterostructure 1630, e.g., n-doped AlGaN, is very resistive. In this situation, without removal of the AlN substrate, electrical current would be collected at an area beside the light-emitting area 1620, on the same side of the device 1600 as the p-contacts 1605 (for example, see the structures of LEDs 1400, 1500 1600 of FIGS. 14 and 15). To obtain higher light output powers, the area of light emitting layer 1620 is made to be relatively large. Electrical current injected at the center of the light emitting layer would have to travel a longer lateral distance within the resistive n-doped layer before reaching an re-contact at the periphery of the device. This current path over the lateral distance could produce large voltage drops and could cause non-uniform current injection.

Removal of the AlN substrate allows contacts to be formed at the back side of the device, thereby providing a more direct current path and less voltage drop between the p-contacts 1602 and the current collection electrodes 1640.

Figure 17:
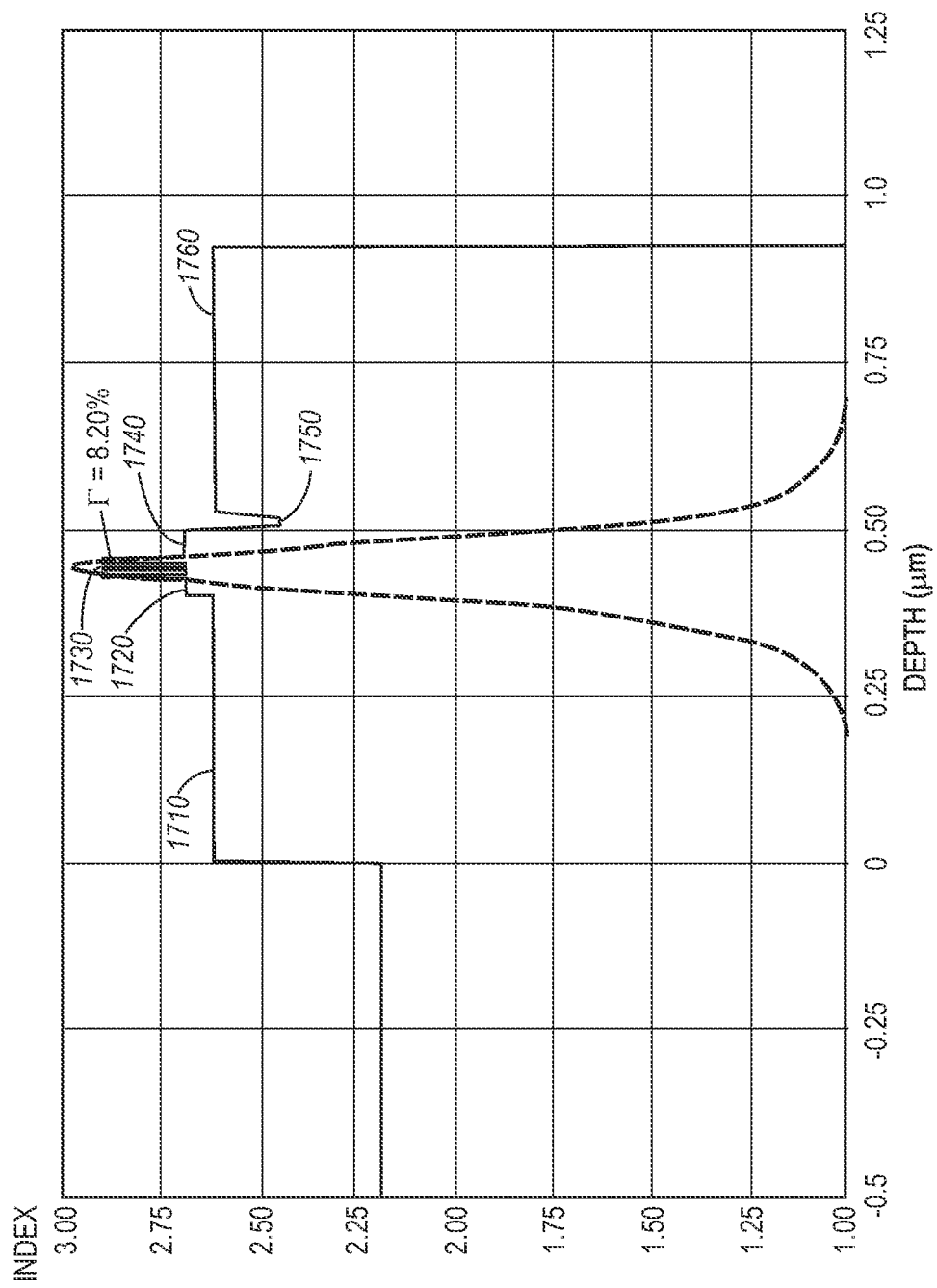
FIG. 17 depicts an energy barrier diagram of laser diode design having an AlN substrate removed according to the processes discussed herein.

Laser diodes (LD) can also benefit from AlN substrate removal or thinning FIG. 17 shows an energy barrier diagram of typical laser diode design (solid line) along with the associated optical mode profile (dashed line). The central frequency of the mode corresponds to a wavelength of about 250 nm. In this design, the overlap between the optical mode and the quantum wells 1730 is represented by $\Gamma=8.26\%$. The LD includes an n-contact 1710, n-SCH 1720, multiple quantum wells 1730, p-SCH 1740, and p-contact 1760.

In a typical UV laser diode made on AlN substrates, substantial modal loss would result if any electric field penetrates into the AlN substrate, because the AlN substrate is highly optically absorbing at the lasing wavelength. An optically absorbing substrate contributes to waveguide materials loss, thus increasing the required gain to achieve lasing. The substrate-side cladding layer needs to be sufficiently thick in order to tightly confine the optical mode within the active region. A thick n-cladding layer, however, contributes to device resistance. Removing or thinning the AlN substrate reduces modal loss and adds design flexibility. Removing/thinning the AlN substrate also enables vertical injection LD structures that provide benefits analogous to the ones described in the LED case.

In some embodiments, substrate removal/thinning may be accomplished only in certain sections of the back side rather than across the entire back side surface. The substrate can be protected from the chemical etchant, and openings at select areas can be made to etch only those areas. For example, openings can be made only at regions directly below the light-emitting layers, so portions of the bulk substrate remain after the etching process and are still available for handling.

In some implementations, epitaxially grown AlN or AlGaN templates and/or substrates, referred to collectively herein as templates/substrates, can be produced as stand-alone components. These templates/substrates can be sold as piece parts, for example, and subsequently used for formation of number of types of devices, including optoelectronic devices such as LEDs and laser diodes and electronic devices such as heterojunction transistors and amplifiers. The epitaxial templates can be formed by growing epitaxial AlN or AlGaN on a bulk crystalline AlN substrate and then removing or thinning the AlN substrate. This technique can produce high quality, optically transparent epitaxially-grown templates/substrates of nitride system materials, such as AlN, AlGaN, InN, InGaN, and/or InAlGaN, which can be used as a base for epitaxial growth in subsequent processing steps. The epitaxial template/substrate may be grown at relatively high growth rates, e.g., above about 1 um per hour to to produce a layer of about 30 μm to about 400 μm. The epitaxially-grown templates/substrates may be formed by metal organic chemical vapor deposition (MOCVD), by hydride vapor phase epitaxy (HVPE) and/or by any combination of these techniques. High quality, optically transparent templates/substrates may be useful for UV optoelectronic devices for the reasons described earlier. The most common orientation is c-plane AlN, but other crystal orientations such as m-plane, a-plane, or semi-polar orientations can also be obtained by cutting the AlN bulk substrate in the desired orientation prior to initiating the epitaxial growth.

Figure 18:
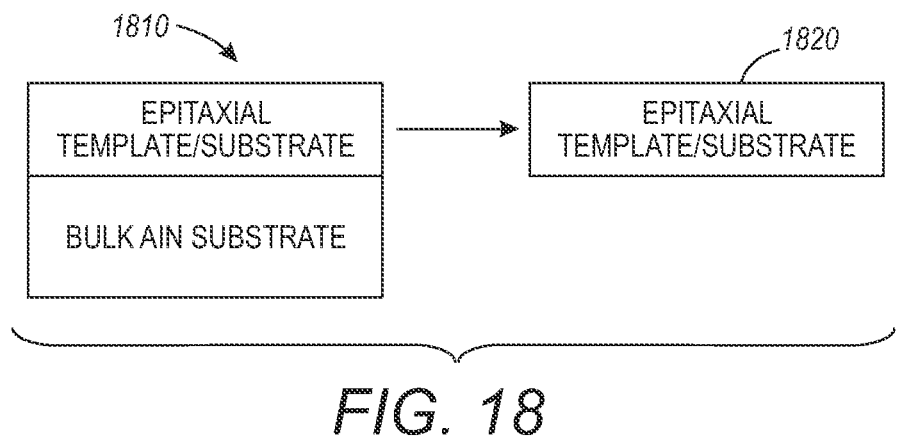
FIGS. 18 and 19, respectively, illustrate the resulting epitaxially grown template/substrate and the process of forming a stand-alone epitaxially grown template/substrate in accordance with some embodiments.
Figure 19:
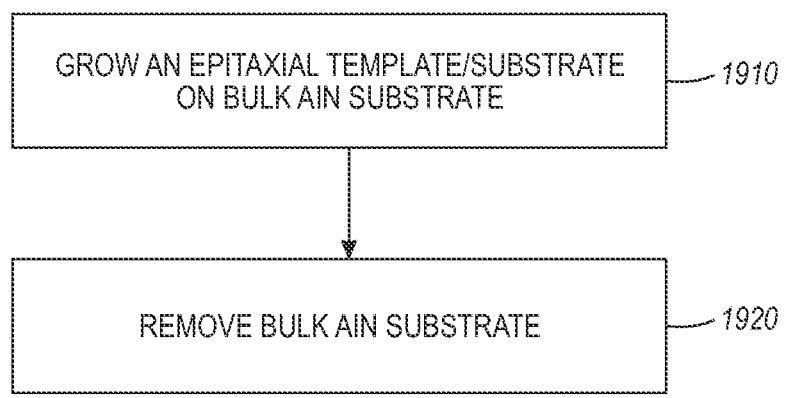

FIGS. 18 and 19 illustrate the process (FIG. 19) of forming a stand-alone epitaxially grown template/substrate and the resulting structure (FIG. 18). An epitaxial layer, e.g., comprising epitaxial AlN, AlGaN, InN, InGaN, and/or InAlGaN, is grown on a bulk crystalline AlN substrate 1910. The resulting structure 1810 is illustrated in FIG. 18. The bulk AlN substrate is removed or thinned 1920 by processes previously described herein, leaving the stand alone epitaxial template/substrate 1820.

Figure 20:
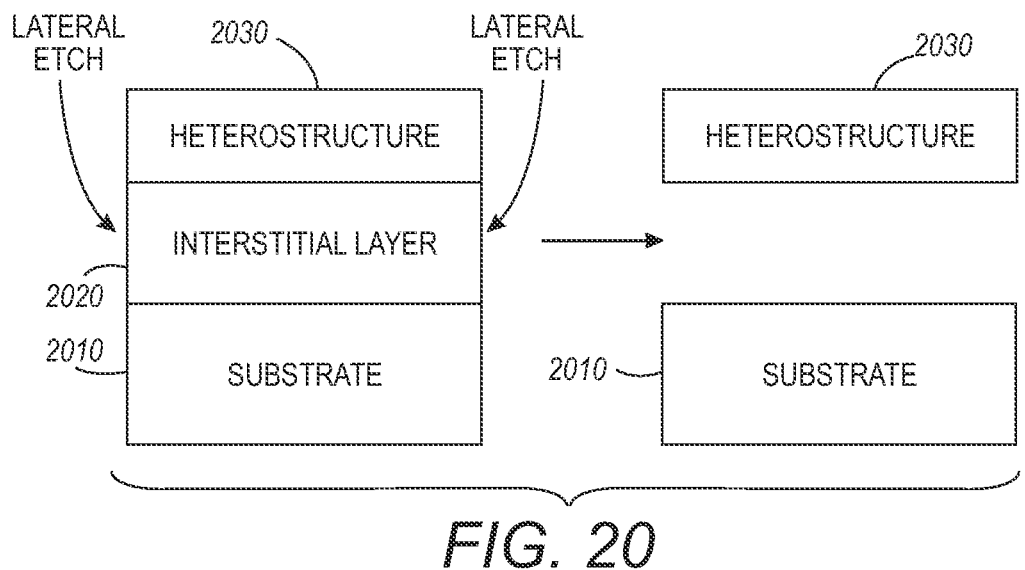
FIG. 20 shows the resulting structure following separation of an epitaxially grown heterostructure from a substrate by etching an interface layer in accordance with some embodiments.
Figure 21:
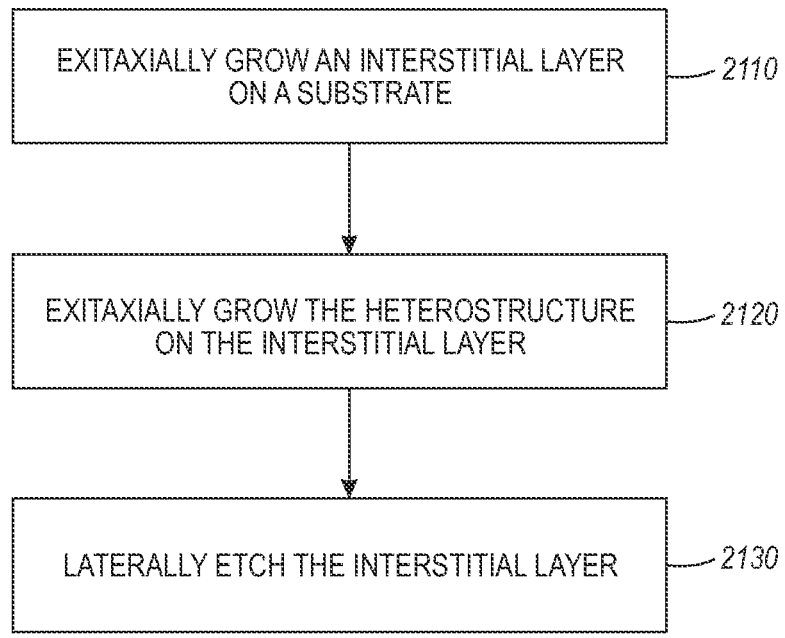
FIG. 21 is a flow diagram that depicts the process of forming an epitaxially grown heterostructure by etching an interface layer to separate the heterostructure from the substrate in accordance with some embodiments.

In some implementations, a structure, e.g., an epitaxial template/substrate, optoelectronic device, or other structure or heterostructure can be grown on an interstitial layer that is grown on various substrates such as AlN, silicon, sapphire, or SiC. These can be separated from the substrate by etching the interstitial layer, thus separating the structure from the substrate. FIG. 21 illustrates the process of forming a stand-alone, epitaxially grown heterostructure from its substrate by etching the interstitial layer. FIG. 20 shows the initial and final states of the structure. An interstitial layer 2020 is epitaxially grown 2110 on a substrate 2010. The structure 2030 is grown 2120 on the interface layer 2020. The interface layer 2020 is laterally etched 2130, separating the structure 2030 from the substrate 2010.

In the foregoing detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims. The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A light emitting device, comprising:
a bulk AlN substrate;
a first heterostructure of the light emitting device grown on the bulk crystalline AlN substrate, the first heterostructure having a first surface, an etch reduction layer, and a second surface, the first surface being an initial surface of heteroepitaxial growth of the light emitting device and a second surface, the first heterostructure comprising an AlGaN etch reduction layer, wherein the etch reduction layer includes the initial surface of heteroepitaxial growth;
a light emitting layer epitaxially grown above the second surface of the first heterostructure; and
a second heterostructure epitaxially grown above the light emitting layer, wherein the bulk crystalline AlN substrate has been substantially removed from the light emitting device over a majority of the initial surface of heteroepitaxial growth leaving a thin AlN layer having an etched surface and wherein a defect density is less than about $10^8$ cm$^{-3}$ throughout a portion of the first heterostructure that is within about 100 nm of the initial surface of heteroepitaxial growth.

2. The light emitting device of claim 1, wherein the first heterostructure is an n-type heterostructure and the second heterostructure is a p-type heterostructure.

3. The light emitting device of claim 1, wherein the first heterostructure comprises AlGaN having an aluminum molar fraction less than about 80%.

4. The light emitting device of claim 1, wherein the etch reduction layer comprises AlGaN having an aluminum molar fraction in a range of about 70% to about 80%.

5. The light emitting device of claim 1, wherein the first heterostructure, the second heterostructure, and the light emitting layer comprise at least one of AlGaN, InGaN, InN, GaN, and InAlGaN.

6. The light emitting device of claim 1, wherein the light emitting device is configured to emit light in a wavelength range of about 200 nm to about 365 nm.

7. The light emitting device of claim 1, wherein the first heterostructure comprises an AlGaN transition region above the bulk AlN substrate which is subsequently removed.

8. The light emitting device of claim 1, wherein light emitted from the light emitting device travels through the first heterostructure.

9. The light emitting device of claim 1, wherein light emitted from the light emitting device travels through the second heterostructure.

10. The light emitting device of claim 1, wherein light is emitted in a direction parallel to the wafer plane.

11. The light emitting device of claim 1, wherein the initial surface of heteroepitaxial growth is textured.

12. The light emitting device of claim 1 wherein the light emitting device comprises a vertical electrical injection LED.

13. The light emitting device of claim 1 wherein the light emitting device comprises a laser.

14. The light emitting device of claim 13, wherein electrodes are formed on the initial surface of heteroepitaxial growth.

15. The light emitting device of claim 13, further comprising a heat sink disposed proximate the second heterostructure.

16. A light emitting device, comprising:
a bulk AlN substrate;
a first epitaxial heterostructure on the bulk AlN substrate and comprising an initial surface of heteroepitaxial growth of the light emitting device and a second surface, the first heterostructure comprising an AlGaN etch stop layer that includes the initial surface of heteroepitaxial growth;
an epitaxial light emitting layer above the second surface of the first hetero structure; and
a second epitaxial heterostructure above the light emitting layer, wherein the device is configured to allow light generated by the light emitting layer in a wavelength range of less than about 365 nm to emerge from the device through the first surface of the first heterostructure, and wherein a defect density is less than about $10^8$ cm$^{-3}$ throughout a portion of the first heterostructure that is within about 100 nm of the initial surface of epitaxial growth.

17. A light emitting device, comprising:
a bulk AlN substrate;
a first epitaxial heterostructure of the light emitting device on the bulk crystalline AlN substrate, the first hetero-structure including an initial surface of heteroepitaxial growth and an AlGaN etch reduction layer that includes the initial surface of heteroepitaxial growth;
an epitaxial light emitting layer above the first heterostructure;
a second epitaxial heterostructure above the light emitting layer, wherein the bulk crystalline AlN substrate has a thin chemically etched thickness of less than about 50 μm and wherein a defect density is less than about $10^8$ cm$^{-3}$ throughout a portion of the first heterostructure that is within about 100 nm of the initial surface of heteroepitaxial growth.

18. The light emitting device of claim 17, wherein the first heterostructure is an n-type heterostructure and the second heterostructure is a p-type heterostructure.

19. The light emitting device of claim 17, wherein the first hetero structure, the second heterostructure, and the light emitting layer comprise at least one of AlGaN, InGaN, InN, GaN, and InAlGaN.

20. The light emitting device of claim 17, wherein the light emitting device is configured to emit light in a wavelength range of about 200 nm to about 365 nm.

21. The light emitting device of claim 17, wherein the first heterostructure comprises an AlGaN transition region grown on the bulk AlN substrate.

22. The light emitting device of claim 17, wherein the initial surface of heteroepitaxial growth is textured.

23. The light emitting device of claim 17, wherein the light emitting device comprises a vertical electrical injection LED.

24. The light emitting device of claim 17, wherein the light emitting device comprises a laser.

25. The light emitting device of claim 23, further comprising a heat sink disposed proximate the second heterostructure.

26. A method of forming light emitting device, comprising:
epitaxially growing a first heterostructure of the light emitting device on a bulk crystalline AlN substrate, the first heterostructure having a first surface, an etch reduction layer, and a second surface, the first surface being an initial surface of heteroepitaxial growth of the light emitting device and a second surface, the first heterostructure comprising a lattice strained AlGaN etch reduction layer, wherein the etch reduction layer includes the initial surface of heteroepitaxial growth;
epitaxially growing a light emitting layer above the second surface of the first heterostructure; and
epitaxially growing a second heterostructure emitting grown above the light emitting layer;
substantially removing the bulk crystalline AlN substrate from the light emitting device over a majority of the initial surface of heteroepitaxial growth, substantial removal of the bulk crystalline AlN substrate relaxing the lattice strain and leaving a thin AlN layer having an etched surface and wherein a defect density is less than about $10^8$ cm$^{-3}$ throughout a portion of the first heterostructure that is within about 100 nm of the initial surface of heteroepitaxial growth.

27. The method of claim 26, wherein the first heterostructure comprises at least one of AlGaN, InGaN, InN, GaN, and InAlGaN.

28. The method of claim 26, wherein substantially removing the bulk AlN substrate comprises removing the bulk AlN substrate over a majority of the initial surface of epitaxial growth.

29. The method of claim 26, wherein substantially removing the bulk AlN substrate comprises chemically etching the bulk AlN substrate to a thickness of less than about 50 μm over a majority of the initial surface of heteroepitaxial growth.

30. The method of claim 26, wherein substantially removing the bulk AlN substrate comprises chemically etching a nitrogen polar face of the bulk AlN substrate using phosphoric acid.

31. The method of claim 26, wherein growing the first heterostructure on the bulk AlN substrate comprises growing the first heterostructure using metal organic chemical vapor deposition, hydride vapor phase epitaxy, or a combination thereof.

* * * * *